(12) United States Patent
Hemink

(10) Patent No.: US 7,911,849 B2
(45) Date of Patent: *Mar. 22, 2011

(54) CONTROLLED BOOSTING IN NON-VOLATILE MEMORY SOFT PROGRAMMING

(75) Inventor: Gerrit Jan Hemink, Yokohama (JP)

(73) Assignee: SanDisk Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/757,833

(22) Filed: Apr. 9, 2010

(65) Prior Publication Data

US 2010/0195397 A1 Aug. 5, 2010

Related U.S. Application Data

(63) Continuation of application No. 11/560,751, filed on Nov. 16, 2006, now Pat. No. 7,697,338.

(51) Int. Cl.
*G11C 16/04* (2006.01)

(52) U.S. Cl. ............ 365/185.19; 365/185.3; 365/185.22

(58) Field of Classification Search ............ 365/185.19, 365/185.3, 185.22
See application file for complete search history.

(56) References Cited

U.S. PATENT DOCUMENTS

| | | | |
|---|---|---|---|
| 5,745,410 A | 4/1998 | Yiu et al. | |
| 6,134,140 A | 10/2000 | Tanaka et al. | |
| 6,249,459 B1 | 6/2001 | Chen et al. | |
| 6,252,803 B1 | 6/2001 | Fastow et al. | |
| 6,381,177 B1 * | 4/2002 | De Sandre et al. | 365/185.19 |
| 6,469,939 B1 | 10/2002 | Wang et al. | |
| 6,522,583 B2 | 2/2003 | Kanda et al. | |
| 6,532,175 B1 | 3/2003 | Yachareni et al. | |
| 6,594,178 B2 | 7/2003 | Choi et al. | |
| 6,798,694 B2 | 9/2004 | Mihnea et al. | |
| 6,859,397 B2 | 2/2005 | Lutze et al. | |
| 6,912,159 B2 | 6/2005 | Osawa et al. | |
| 6,940,752 B2 | 9/2005 | Tanaka et al. | |
| 7,009,881 B2 | 3/2006 | Noguchi | |
| 7,023,733 B2 | 4/2006 | Guterman et al. | |
| 7,092,290 B2 | 8/2006 | Hemink | |
| 7,180,781 B2 | 2/2007 | Abedifard et al. | |
| 7,286,408 B1 | 10/2007 | Higashitani | |
| 7,295,478 B2 | 11/2007 | Wan et al. | |
| 7,301,817 B2 | 11/2007 | Li et al. | |

(Continued)

OTHER PUBLICATIONS

U.S. Appl. No. 11/560,744, filed Nov. 16, 2006.

(Continued)

*Primary Examiner* — Son Dinh
*Assistant Examiner* — Nam T Nguyen
(74) *Attorney, Agent, or Firm* — Vierra Magen Marcus & DeNiro LLP

(57) ABSTRACT

A soft programming pre-charge voltage provides boosting control during soft programming operations for non-volatile memory devices. A pre-charge voltage can be applied to the word lines of a block of memory cells to enable pre-charging of the channel region of a NAND string to be inhibited from soft programming. The level of boosting in the channel region of the inhibited NAND string is governed by the pre-charge voltage and the soft programming voltage. By controlling the pre-charge voltage, more reliable and consistent channel boosting can be achieved. In one embodiment, the pre-charge voltage is increased between applications of the soft programming voltage to reduce or eliminate a rise in the channel's boosted potential. In one embodiment, the soft programming pre-charge voltage level(s) is determined during testing that is performed as part of a manufacturing process.

19 Claims, 15 Drawing Sheets

U.S. PATENT DOCUMENTS

| | | |
|---|---|---|
| 7,355,889 B2 | 4/2008 | Hemink et al. |
| 7,440,323 B2 | 10/2008 | Lutze et al. |
| 7,440,326 B2 | 10/2008 | Ito |
| 7,486,564 B2 | 2/2009 | Hemink et al. |
| 7,499,338 B2 | 3/2009 | Ito |
| 7,535,763 B2 | 5/2009 | Hemink |
| 7,545,675 B2 | 6/2009 | Kamei |
| 7,697,338 B2 | 4/2010 | Hemink |
| 2001/0015910 A1 | 8/2001 | Choi |
| 2002/0110019 A1 | 8/2002 | Satoh et al. |
| 2003/0147279 A1 | 8/2003 | Pan et al. |
| 2005/0122780 A1 | 6/2005 | Chen et al. |
| 2005/0265097 A1 | 12/2005 | Tanaka et al. |
| 2006/0044919 A1 | 3/2006 | Taoka et al. |
| 2008/0084747 A1 | 4/2008 | Hemink et al. |

OTHER PUBLICATIONS

U.S. Appl. No. 11/560,751, filed Nov. 16, 2006.

International Search Report & The Written Opinion of the International Searching Authority dated May 19, 2008, Patent Cooperation Treaty, International Application No. PCT/US2007/084463 filed Nov. 12, 2007.

Restriction Requirement dated Aug. 7, 2008, United States Patent & Trademark Office, U.S. Appl. No. 11/560,744, filed Nov. 16, 2006.

Response to Restriction Requirement dated Sep. 3, 2008, U.S. Appl. No. 11/560,744, filed Nov. 16, 2006.

Non-Final Office Action dated Oct. 7, 2008, United States Patent & Trademark Office, U.S. Appl. No. 11/560,744, filed Nov. 16, 2006.

Response to Non-Final Office Action dated Jan. 7, 2009, U.S. Appl. No. 11/560,744, filed Nov. 16, 2006.

Notice of Allowance and Fee(s) Due dated Jan. 16, 2006, United States Patent & Trademark Office, U.S. Appl. No. 11/560,744, filed Nov. 16, 2006.

International Exam Report dated May 28, 2009, Patent Cooperation Treaty, International Application No. PCT/US2007/084463 filed Nov. 12, 2007.

Non-Final Office Action dated Jun. 10, 2009, United States Patent & Trademark Office, U.S. Appl. No. 11/560,751, filed Nov. 16, 2006.

Response to Non-Final Office Action dated Aug. 27, 2009, U.S. Appl. No. 11/560,751, filed Nov. 16, 2006.

Notice of Allowance and Fee(s) Due dated Nov. 25, 2009, United States Patent & Trademark Office, U.S. Appl. No. 11/560,751, filed Nov. 16, 2006.

\* cited by examiner

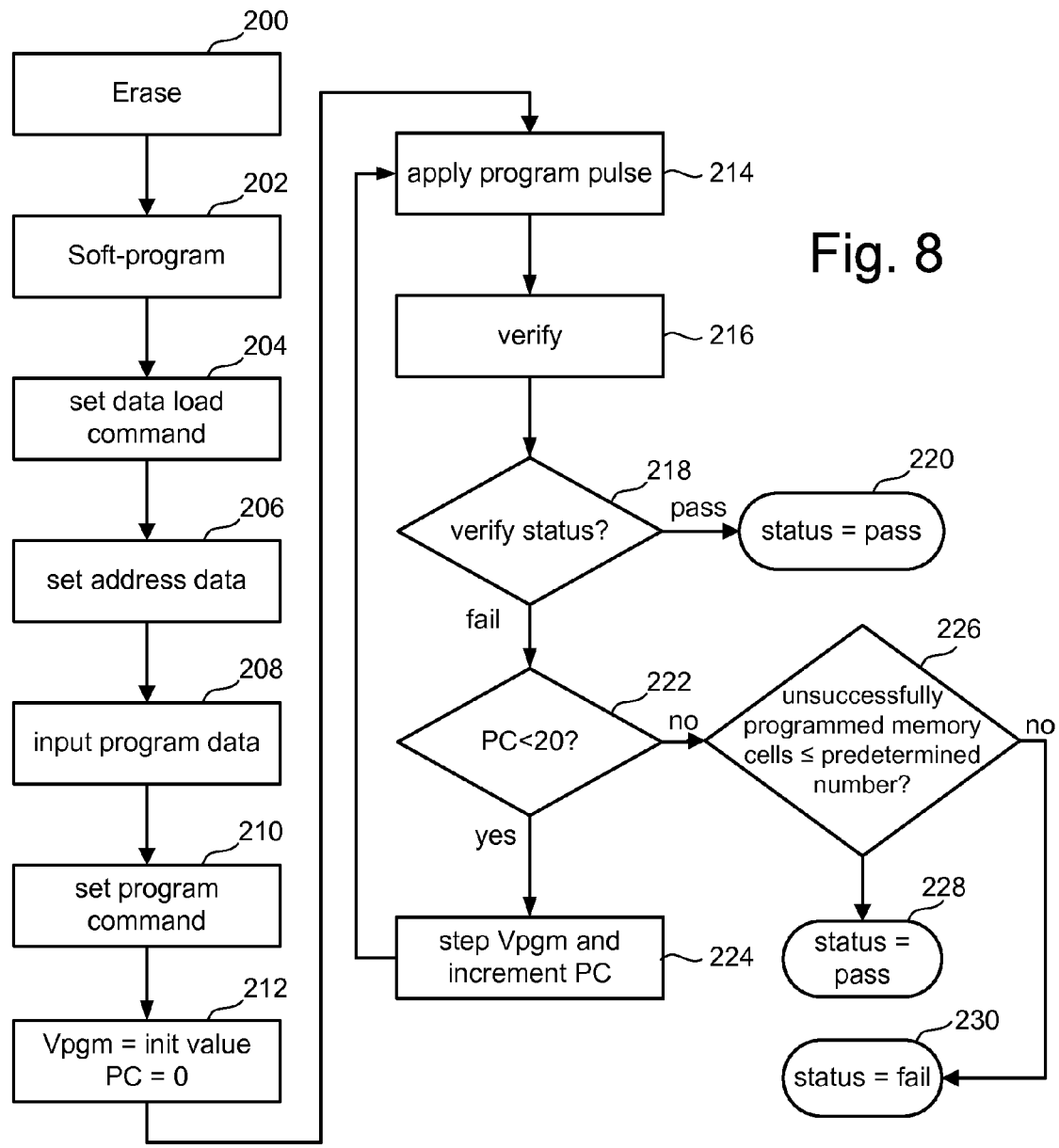

CONTROLLED BOOSTING IN NON-VOLATILE MEMORY SOFT PROGRAMMING

CLAIM OF PRIORITY

This application is a continuation application of U.S. patent application Ser. No. 11/560,751, now U.S. Pat. No. 7,697,338, entitled "SYSTEMS FOR CONTROLLED BOOSTING IN NON-VOLATILE MEMORY SOFT PROGRAMMING," filed Nov. 16, 2006 and incorporated herein by reference in its entirety.

CROSS-REFERENCE TO RELATED APPLICATIONS

The following application is cross-referenced and incorporated by reference herein in its entirety:

U.S. patent application Ser. No. 11/560,744 entitled "Controlled Boosting During Non-Volatile Memory Soft Programming," by Gerrit Jan Hemink, filed on Nov. 16, 2006, now U.S. Pat. No. 7,535,763.

BACKGROUND OF THE INVENTION

1. Field of the Invention

Embodiments of the present disclosure are directed to non-volatile memory technology.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM), including flash EEPROM, and Electronically Programmable Read Only Memory (EPROM) are among the most popular non-volatile semiconductor memories.

One example of a flash memory system uses the NAND structure, which includes arranging multiple transistors in series between two select gates. The transistors in series and the select gates are referred to as a NAND string. FIG. 1 is a top view showing one NAND string 30. FIG. 2 is an equivalent circuit thereof. The NAND string depicted in FIGS. 1 and 2 includes four transistors 10, 12, 14 and 16 in series between a first select gate 12 and a second select gate 22. Select gate 12 connects the NAND string to bit line 26. Select gate 22 connects the NAND string to source line 28. Select gate 12 is controlled by applying appropriate voltages to control gate 20CG via selection line SGD. Select gate 22 is controlled by applying the appropriate voltages to control gate 22CG via selection line SGS. Each of the transistors 10, 12, 14 and 16 includes a control gate and a floating gate, forming the gate elements of a memory cell. For example, transistor 10 includes control gate 10CG and floating gate 10FG. Transistor 12 includes control gate 12CG and a floating gate 12FG. Transistor 14 includes control gate 14CG and floating gate 14FG. Transistor 16 includes a control gate 16CG and a floating gate 16FG. Control gate 10CG is connected to word line WL3, control gate 12CG is connected to word line WL2, control gate 14CG is connected to word line WL1, and control gate 16CG is connected to word line WL0. Another type of memory cell useful in flash EEPROM systems utilizes a non-conductive dielectric material in place of a conductive floating gate to store charge in a non-volatile manner.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, etc. The discussion herein is not limited to any particular number of memory cells in a NAND string. Relevant examples of NAND-type flash memories and their operation are provided in the following U.S. patents/patent applications, all of which are incorporated herein by reference in their entirety: U.S. Pat. No. 5,570,315; U.S. Pat. No. 5,774,397; U.S. Pat. No. 6,046,935; U.S. Pat. No. 5,386,422; U.S. Pat. No. 6,456,528; and U.S. patent application Ser. No. 09/893,277 (Publication No. US2003/0002348). Other types of non-volatile memory in addition to NAND flash memory can also be used in accordance with embodiments.

A typical architecture for a flash memory system using a NAND structure will include several NAND strings. For example, FIG. 3 shows three NAND strings 40, 42 and 44 of a memory array having many more NAND strings. Each of the NAND strings of FIG. 3 includes two select transistors or gates and four memory cells. For example, NAND string 40 includes select transistors 50 and 60, and memory cells 52, 54, 56 and 58. NAND string 42 includes select transistors 70 and 80, and memory cells 72, 74, 76 and 78. Each string is connected to the source line by a select gate 60, 80, etc. A selection line SGS is used to control the source side select gates. The various NAND strings are connected to respective bit lines by select gates 50, 70, etc., which are controlled by select line SGD. In other embodiments, the select lines do not necessarily need to be in common. Word line WL3 is connected to the control gates for memory cell 52 and memory cell 72. Word line WL2 is connected to the control gates for memory cell 54 and memory cell 74. Word line WL1 is connected to the control gates for memory cell 56 and memory cell 76. Word line WL0 is connected to the control gates for memory cell 58 and memory cell 78. As can be seen, a bit line and respective NAND string comprise a column of the array of memory cells. The word lines comprise the rows of the array. Each word line connects the control gates of each memory cell in the row. For example, word line WL2 is connected to the control gates for memory cells 54, 74 and 94. In many implementations, the word lines form the control gate of each memory cell in the row.

FIG. 4 illustrates an exemplary array 100 of NAND strings, such as those shown in FIGS. 1-3. Along each column, a bit line 26 is coupled to a drain terminal of the bit line select gate for the NAND string. Along each row of NAND strings, a source line 28 may connect all the source terminals of the source line select gates of the NAND strings.

The array 100 of memory cells is divided into a large number of blocks of memory cells. As is common for flash EEPROM systems, the block is the unit of erase and may be referred to as an erase block or physical block. Each block can contain the minimum number of memory cells that are erased together, although multiple blocks may be erased simultaneously. Smaller units of cells may be erased together in some implementations. In FIG. 4, a block includes the cells connected to a common set of word lines WL0-WL3. For example, block 90 includes NAND strings 40 and 42 and each other string 30 connected to word lines WL0-WL3.

When programming an EEPROM or flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. The floating gate charge and threshold voltage of the cell can be indicative of a particular state corresponding to stored data (analog or digital). More information about programming can be found in U.S. patent application Ser. No. 10/379,608, titled "Self Boosting Technique," filed on Mar. 5, 2003; and in U.S. patent application Ser. No. 10/629,068, titled "Detecting Over Programmed Memory," filed on Jul. 29, 2003, both applications are incorporated herein by reference in their entirety.

In order to erase memory cells of a NAND type flash memory, electrons are transferred from the floating gate of each memory cell to the well region and substrate. Typically, one or more high voltage erase pulses are applied to the well region to attract electrons away from the floating gate of each memory cell to the well region. The word lines of each memory cell are grounded or supplied with 0V to create a high potential across the tunnel oxide region to attract the electrons. If each memory cell of a NAND string is not erased after application of an erase voltage pulse, the size of the pulse can be increased and reapplied to the NAND string until each memory cell is erased.

It is common for individual memory cells to erase at different rates and to different threshold voltage levels during erase operations. Slight variations in device dimensions, spacing and/or material compositions for instance, will influence the behavior of individual memory cells within a block or string of memory cells. Consequently, some memory cells will undergo a larger or smaller shift in threshold voltage when subjected to an erase voltage as compared to other memory cells. Moreover, groupings of memory cells such as a NAND string are often verified for an erased state or condition simultaneously. If any memory cell of the string is not erased as detected by a verify operation, the entire NAND string is enabled for erasing during application of an additional erase voltage pulse. This can result in faster erasing cells being placed into a deeper erased state than desired. The range or distribution of threshold voltages for a group of erased cells is increased by such factors.

A technique generally referred to as soft programming has been used to adjust the threshold voltages of one or more memory cells during erase operations. Soft programming can tighten or narrow the distribution of threshold voltages for a group of memory cells after being erased. Soft programming typically attempts to shift the threshold voltage of one or more memory cells closer to the verify level used during erasing. Soft programming includes applying a relatively low program voltage—lower than that used for actual programming—to one or more memory cells. Typically a program voltage is applied as a series of pulses that are increased between each application. Like erase operations, soft programming is often carried out at the block level by applying the soft programming voltage pulses to every word line of a block of memory cells. For example, soft programming voltage pulses may be applied to word lines WL0, WL1, WL2, and WL3 of block 90 to soft program each cell of block 90. Individual NAND strings are verified for a soft programmed condition after application of one or more soft programming pulses. If a NAND string is determined to be soft programmed, it is necessary to inhibit it from soft programming during subsequent applications of the soft programming voltage to continue soft programming other NAND strings sharing the common set of word lines. For example, it may be necessary to inhibit memory cells 72, 74, 76, and 78 of NAND string 42 from being soft programmed, while continuing to apply soft programming pulses to soft program memory cells 52, 54, 56, and 58 of NAND string 40.

Traditionally, soft programming is inhibited in a particular NAND string by raising the bit line voltage for the string. After raising the bit line voltage, the NAND string is electrically disconnected from the bit line by turning off the drain select gate. Because the NAND string is electrically disconnected from the bit line, the soft programming voltage applied to the word lines will cause the channel region of the inhibited NAND string to be boosted to a positive voltage level due to capacitive charge coupling. The positive voltage level of the NAND string eliminates the large voltage potential necessary to inject electrons into the floating gate regions of the memory cells, and thus, inhibits soft programming.

If the boosting is not sufficient in a NAND string to be inhibited from soft programming, the memory cells of the string may inadvertently be soft programmed. For example, when applying the soft programming voltage to word lines WL0, WL1, WL2, and WL3 to soft program NAND string 40 while inhibiting NAND string 42, one of the memory cells 72, 74, 76, or 80 of NAND string 42 may inadvertently be soft programmed. This type of inadvertent soft programming is often referred to as soft programming disturb.

SUMMARY OF THE INVENTION

A soft programming pre-charge voltage provides boosting control during soft programming operations for non-volatile memory devices. A pre-charge voltage can be applied to the word lines of a block of memory cells to enable pre-charging of the channel region of a NAND string to be inhibited from soft programming. The level of boosting in the channel region of the inhibited NAND string is governed by the pre-charge voltage and the soft programming voltage. By controlling the pre-charge voltage, more reliable and consistent channel boosting can be achieved. In one embodiment, the pre-charge voltage is increased between applications of the soft programming voltage to reduce or eliminate a rise in the channel's boosted potential. In one embodiment, the soft programming pre-charge voltage level(s) is determined during testing that is performed as part of a manufacturing process.

One embodiment includes applying a first voltage to a set of word lines coupled to a plurality of groups of non-volatile storage elements to enable pre-charging of a first subset of the groups to be inhibited from soft programming. The first voltage is different than a pass voltage applied to unselected word lines during read operations. An inhibit voltage is applied to the first subset of groups in order to pre-charge a channel region of each group of said first subset. A soft programming voltage is applied to the set of word lines to soft program storage elements of a second subset of groups after applying the first voltage.

In one embodiment, soft programming can include applying a first voltage to a set of word lines coupled to a plurality of groups of non-volatile storage elements to enable pre-charging of groups of the plurality to be inhibited from soft programming. A first soft programming voltage is applied to the set of word lines after applying the first voltage to soft program groups of the plurality to be soft programmed. It is determined which groups of the plurality are adequately soft programmed after soft programming. A second voltage is applied to the set of word lines to enable pre-charging of groups of the plurality determined to be adequately soft programmed. The second voltage is different than the first voltage. Soft programming of groups of the plurality determined to not be adequately soft programmed is then performed by applying a second soft programming voltage to the set of word lines after applying the second voltage.

Various embodiments can include non-volatile storage elements and managing circuitry in communication with the storage elements to perform the various described processes. The managing circuitry can include such elements as control circuitry (e.g. including a state machine), row and column decoders, read/write circuits, and/or a controller for example.

BRIEF DESCRIPTION OF THE DRAWINGS

FIG. 7 depicts an exemplary voltage signal that can be used for programming and verifying programming of non-volatile memory.

FIG. 8 is a flowchart depicting an exemplary method of programming non-volatile memory.

DETAILED DESCRIPTION

Figure 5:
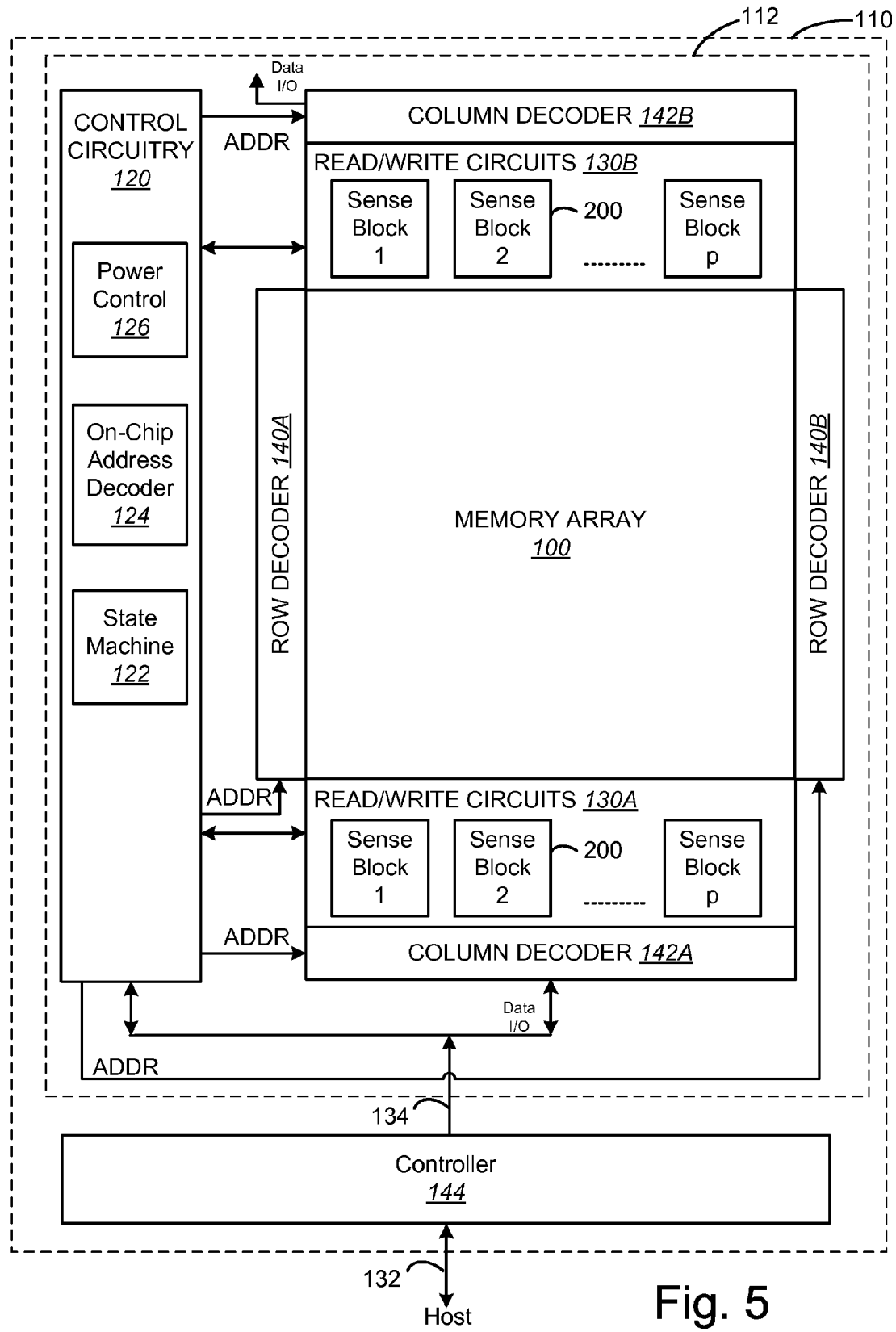
FIG. 5 is a block diagram of a non-volatile memory system.

FIG. 5 illustrates a memory device 110 having read/write circuits for reading and programming a page of memory cells in parallel. Memory device 110 may include one or more memory die or chips 112. Memory die 112 includes a two-dimensional array of memory cells 100, control circuitry 120, and read/write circuits 130A and 130B. In one embodiment, access to the memory array 100 by the various peripheral circuits is implemented in a symmetric fashion, on opposite sides of the array, so that the densities of access lines and circuitry on each side are reduced by half. The read/write circuits 130A and 130B include multiple sense blocks 200 which allow a page of memory cells to be read or programmed in parallel. The memory array 100 is addressable by word lines via row decoders 140A and 140B and by bit lines via column decoders 142A and 142B. In a typical embodiment a controller 144 is included in the same memory device 110 (e.g., a removable storage card or package) as the one or more memory die 112. Commands and data are transferred between the host and controller 144 via lines 132 and between the controller and the one or more memory die 112 via lines 134. The controller can include an optional RAM memory 131 in one embodiment to assist in data transfer.

The control circuitry 120 cooperates with the read/write circuits 130A and 130B to perform memory operations on the memory array 100. The control circuitry 120 includes a state machine 122, an on-chip address decoder 124 and a power control module 126. The state machine 122 provides chip-level control of memory operations. The on-chip address decoder 124 provides an address interface between that used by the host or a memory controller to the hardware address used by the decoders 140A, 140B, 142A, and 142B. The power control module 126 controls the power and voltages supplied to the word lines and bit lines during memory operations.

Figure 6:
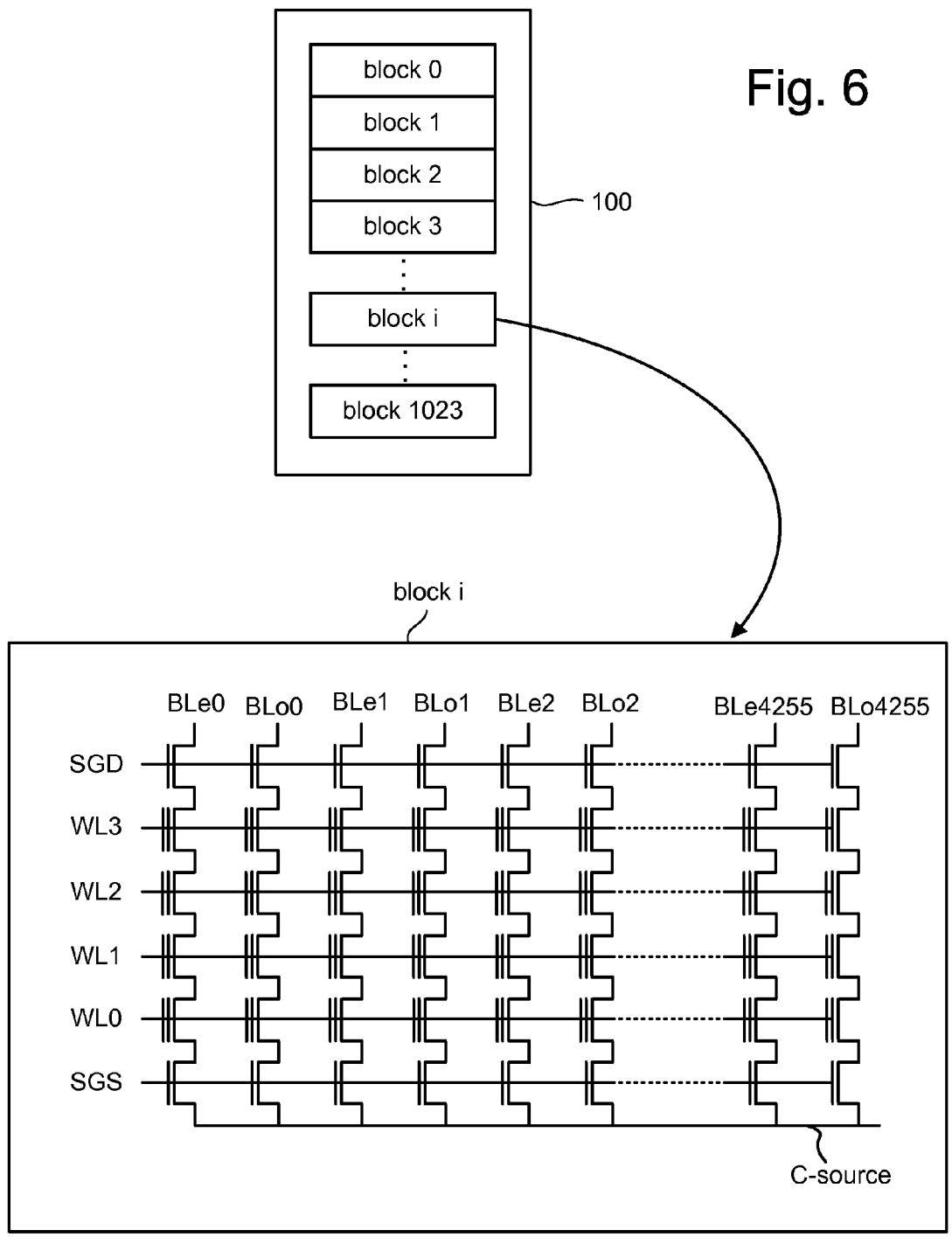
FIG. 6 depicts an exemplary organization of a non-volatile memory array.

With reference to FIG. 6, an exemplary structure of memory cell array 100 is described. As one example, a NAND flash EEPROM is described that is partitioned into 1,024 blocks. Each block of memory cells includes a set of bit lines forming columns and a set of word lines forming rows. Each block is typically divided into a number of pages. A page is typically a minimum unit of programming or reading, although more than one page may be programmed or read in a single operation. In another embodiment, the individual pages may be divided into segments and the segments may contain the fewest number of cells that are written at one time as a basic programming operation. One or more pages of data are typically stored in one row of memory cells. A page can store one or more sectors of data, the size of which is generally defined by a host system. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than those of the user data to which they pertain. A sector of user data is typically 512 bytes, corresponding to the size of a sector commonly used in magnetic disk drives. Overhead data is typically an additional 16-20 bytes. A large number of pages form a block, anywhere from 8 pages, for example, up to 32, 64 or more pages. In some embodiments, a row of NAND strings comprises a block.

FIG. 6 shows four memory cells connected in series to form a NAND string. Although four cells are shown to be included in each NAND string, more or less than four can be used (e.g., 16, 32, or another number). One terminal of the NAND string is connected to a corresponding bit line via a first select transistor or gate (connected to select gate drain line SGD), and another terminal is connected to c-source via a second select transistor (connected to select gate source line SGS). The data stored in each block can be simultaneously erased. In each block of the example in FIG. 6 there are 8,512 columns that are divided into even columns and odd columns. The bit lines are divided into even bit lines (BLe) and odd bit lines (BLo). In an odd/even bit line architecture, memory cells along a common word line and connected to the odd bit lines are programmed at one time, while memory cells along a common word line and connected to even bit lines are programmed at another time. Therefore, 532 bytes of data can be read or programmed simultaneously. These 532 bytes of data that are simultaneously read or programmed form a logical page. Therefore, in this example, one block can store at least eight pages. When each memory cell stores two bits of data (e.g. a multi-level cell), one block stores 16 pages. Other sized blocks and pages can also be used with embodiments. Additionally, architectures other than that of FIGS. 5 and 6 can also be used to implement embodiments in accordance with the present disclosure.

In other embodiments, the bit lines are not divided into odd and even bit lines. Such architectures are commonly referred to as all bit line architectures. In an all bit line architecture, all the bit lines of a block are simultaneously selected during read and program operations. Memory cells along a common word line and connected to any bit line are programmed at the same time. In other embodiments, the bit lines or block can be broken up into other groupings (e.g., left and right, more than two groupings, etc.).

When programming a memory cell in one example, the drain and the p-well receive 0V while the control gate receives a series of programming pulses with increasing magnitudes. In one embodiment, the magnitudes of the pulses in the series range from 12V to 24V. In other embodiments, the range of pulses in the series can be different, for example, having a starting level of higher than 12V. During programming of memory cells, verify operations are carried out in the periods between the programming pulses. That is, the programming level of each cell of a group of cells being programmed in parallel is read between each programming pulse to determine whether or not it has reached or exceeded a verify level to which it is being programmed. One means of verifying the programming is to test conduction at a specific compare point. The cells that are verified to be sufficiently programmed are locked out, for example in NAND cells, by raising the bit line voltage from 0 to $V_{DD}$ (e.g., 1.8V-3.3V) for all subsequent programming pulses to terminate the programming process for those cells. In some cases, the number of pulses will be limited (e.g. 20 pulses) and if a given memory cell is not sufficiently programmed by the last pulse, an error is assumed. In some implementations, memory cells are erased (in blocks or other units) prior to programming.

FIG. 7 depicts a program voltage signal in accordance with one embodiment. This signal has a set of pulses with increasing magnitudes. The magnitude of the pulses is increased with each pulse by a predetermined step size. In one embodiment that includes the memory cells storing multiple bits of data, an exemplary step size is 0.2 volts (or 0.4 volts). Between each of the program pulses are the verify pulses. The signal of FIG. 7 assumes a four state memory cell, therefore, it includes three verify pulses. For example, between programming pulses 250 and 252 are three sequential verify pulses. The first verify pulse 254 is depicted at a zero volt verify voltage level. The second verify pulse 256 follows the first verify pulse at the second verify voltage level. The third verify pulse 258 follows the second verify pulse 256 at the third verify voltage level. A multi-state memory cell capable of storing data in eight states, for example, may need to perform verify operations at seven compare points. Thus, seven verify pulses would applied in sequence to perform seven verify operations at seven verify levels between two consecutive programming pulses. Based on the seven verify operations, the system can determine the state of the memory cells. One means for reducing the time burden of verifying is to use a more efficient verify process, for example, as disclosed in: U.S. patent application Ser. No. 10/314,055, entitled "Smart Verify for Multi-State Memories," filed Dec. 5, 2002; U.S. patent application Ser. No. 11/259,799, entitled "Apparatus for Programming of Multi-State Non-Volatile Memory Using Smart Verify," filed Oct. 27, 2005; and U.S. patent application Ser. No. 11/260,658, entitled "Method for Programming of Multi-State Non-Volatile Memory Using Smart Verify," filed Oct. 27, 2005, all of which are incorporated herein by reference in their entirety.

FIG. 8 is a flow chart describing one embodiment of a method for programming non-volatile memory. The memory cells to be programmed are erased at step 200. Step 200 can include erasing more memory cells than those to be programmed (e.g., in blocks or other units). At step 202, soft programming is performed to narrow the distribution of erased threshold voltages for the erased memory cells. Some memory cells may be in a deeper erased state than necessary as a result of the erase process. Soft programming can apply small programming pulses to move the threshold voltage of the erased memory cells closer to the erase verify level. At step 204, a "data load" command is issued by controller 144 and input to control circuitry 120, allowing data to be input to a data input/output buffer. The input data is recognized as a command and latched by state machine 122 via a command latch signal, not illustrated, input to control circuitry 120. At step 206, address data designating the page address is input to row controllers or decoders 140A and 140B from the controller or host. The input data is recognized as the page address and latched via state machine 122, affected by the address latch signal input to the control circuitry. At step 208, a page of program data for the addressed page is input to a data input/output buffer for programming. For example, 532 bytes of data could be input in one embodiment. That data is latched in the appropriate registers for the selected bit lines. In some embodiments, the data is also latched in a second register for the selected bit lines to be used for verify operations. At step 210, a "program" command is issued by the controller and input to the data input/output buffer. The command is latched by state machine 122 via the command latch signal input to the control circuitry.

Triggered by the "program" command, the data latched in step 208 will be programmed into the selected memory cells controlled by state machine 122 using the stepped pulses of FIG. 7 applied to the appropriate word line. At step 212, $V_{PGM}$, the programming pulse voltage level applied to the selected word line, is initialized to the starting pulse (e.g., 12V) and a program counter PC maintained by state machine 122 is initialized at 0. At step 214, the first $V_{PGM}$ pulse is applied to the selected word line. If logic "0" is stored in a particular data latch indicating that the corresponding memory cell should be programmed, then the corresponding bit line is grounded. On the other hand, if logic "1" is stored in the particular latch indicating that the corresponding memory cell should remain in its current data state, then the corresponding bit line is connected to $V_{DD}$ to inhibit programming.

At step 216, the states of the selected memory cells are verified. If it is detected that the target threshold voltage of a selected cell has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine knows that all selected cells have been programmed. At step 218, it is checked whether all of the data latches are storing logic "1." If so, the programming process is complete and successful because all selected memory cells were programmed and verified to their target states. A status of "PASS" is reported at step 220. Note that in some embodiments, at step 218, not all data latches have to store a logic "1." It can be sufficient if at least a predetermined number of data latches store a logic "1." Data latches that still store a logic "0" are associated with cells that are not yet programmed (slow programming cells) or with defective cells. A limited number of insufficiently programmed cells or defective cells can be tolerated as during subsequent read operations, error correction (ECC) can be applied to correct the corrupted data associated with the slow programming or defective memory cells.

If, at step 218, it is determined that not all of the data latches are storing logic "1," then the programming process continues. At step 222, the program counter PC is checked against a program limit value. One example of a program limit value is 20, however, other values can be used. If the program counter PC is not less than 20, then it is determined at step 226 whether the number of cells that have not been successfully programmed is equal to or less than a predetermined number. If the number of unsuccessfully programmed bits is equal to or less than the predetermined number, then the programming process is flagged as passed and a status of pass is reported at step 228. The bits that are not successfully programmed can be corrected using error correction during the read process. If however, the number of unsuccessfully programmed bits is greater than the predetermined number, the program process is flagged as failed and a status of fail is reported at step 230. If the program counter PC is less than 20, then the $V_{PGM}$ level is increased by the step size and the program counter PC is incremented at step 224. After step 224, the process loops back to step 214 to apply the next $V_{PGM}$ pulse.

The flowchart of FIG. 8 depicts a single-pass programming method as can be applied for binary storage. In a two-pass programming method as can be applied for multi-level storage, for example, multiple programming or verification steps may be used in a single iteration of the flowchart. Steps 212-230 may be performed for each pass of the programming operation. In a first pass, one or more program pulses may be applied and the results thereof verified to determine if a cell is in the appropriate intermediate state. In a second pass, one or more program pulses may be applied and the results thereof verified to determine if the cell is in the appropriate final state.

Figure 9:
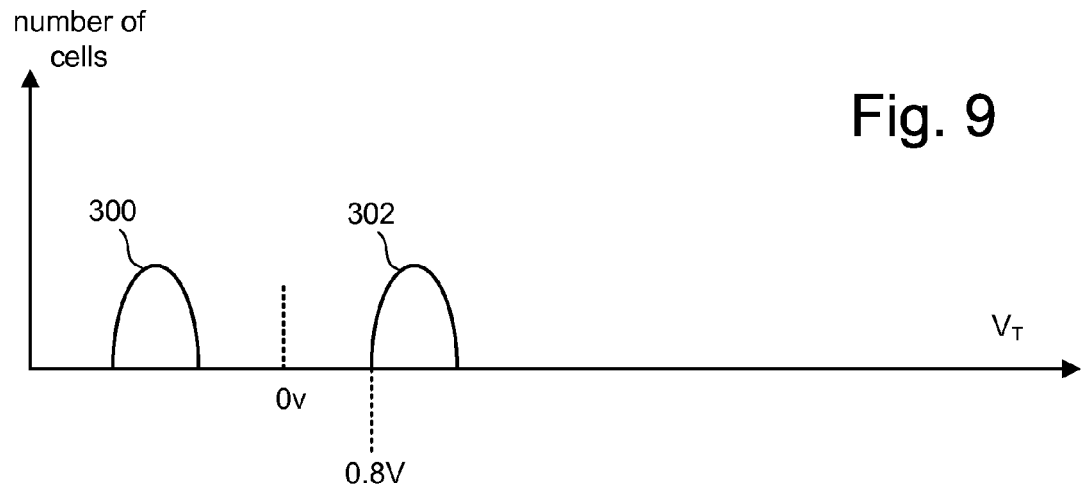
FIG. 9 is a graph depicting the distribution of threshold voltages for a group of non-volatile memory cells that have been programmed.

At the end of a successful program process, the threshold voltages of all or almost all of the memory cells should be within one or more distributions of threshold voltages for programmed memory cells or within a distribution of threshold voltages for erased memory cells. The range of possible threshold voltages of a memory cell can be divided into ranges which represent distinct memory states. For example, two ranges of threshold voltages can be used to establish two memory states that are assigned logical data "1" and "0." FIG. 9 illustrates threshold voltage distributions for a memory cell array when each memory cell stores one bit of data. FIG. 9 shows a first distribution 300 of threshold voltages for erased memory cells and a second distribution 302 of threshold voltages for programmed memory cells.

At least one reference threshold voltage level is generally established so as to partition the threshold voltage memory window of the memory cell into the two ranges. When the cell is read by applying predetermined, fixed voltages (e.g., read reference voltages) to its gate that correspond to the reference threshold voltage level, its source/drain conduction state is established by comparing the conduction with a breakpoint level or reference current. If the current read is higher than that of the reference current level, the cell is determined to be "on" and in one logical state. If the current is less than the reference current level, the cell is determined to be "off" and in the other logical state. In one embodiment, the threshold voltage levels in the first distribution 300 are negative and correspond to logic "1" while the threshold voltage levels in the second distribution 302 are positive and correspond to logic "0." When the threshold voltage is negative and a read is attempted by applying 0V to the control gate, the memory cell will turn on to indicate logic 1 is being stored. When the threshold voltage is positive and a read operation is attempted by applying 0V to the control gate, the memory cell will not turn on to indicate that logic 0 is being stored.

A memory cell can also store multiple bits of digital data by utilizing more than two ranges of threshold voltages to represent distinct memory states. The threshold voltage window can be divided into the number of desired memory states and multiple voltage breakpoint levels used to resolve the individual states. For example, if four states are used, there will be four threshold voltage ranges representing four distinct memory states which can be assigned the data values 11, 10, 01, and 00. The specific relationship between the data programmed into the memory cell and the threshold voltage ranges of the cell depends upon the data encoding scheme adopted for the memory cells. U.S. Pat. No. 6,222,762 and U.S. patent application Ser. No. 10/461,244, "Tracking Cells For A Memory System," filed on Jun. 13, 2003, both of which are incorporated herein by reference in their entirety, describe various data encoding schemes for multi-state flash memory cells.

Figure 10:
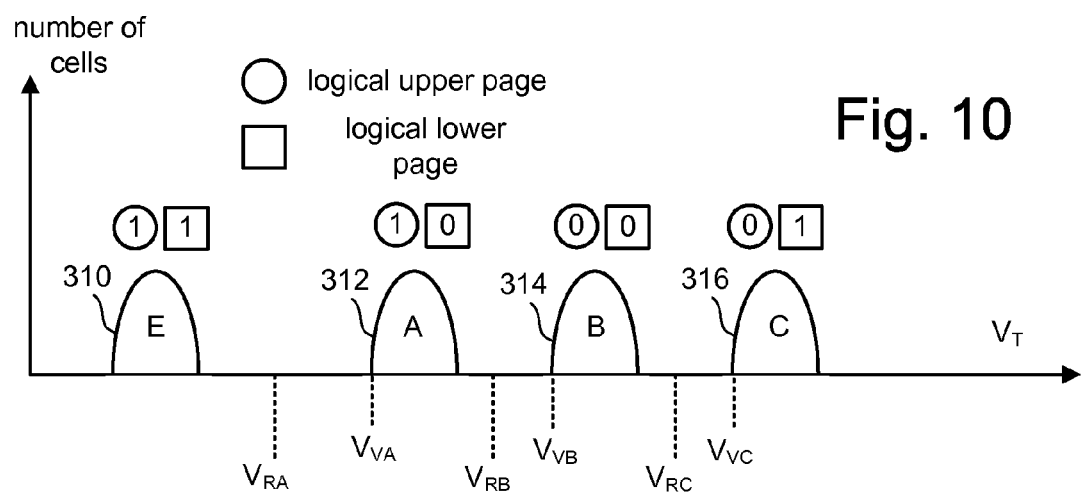
FIG. 10 is a graph depicting the distribution of threshold voltages for a group of non-volatile memory cells storing 2 bits of data using four physical states.

FIG. 10 illustrates exemplary threshold voltage distributions for a memory cell array when each memory cell stores two bits of data in four physical states. Distribution 310 represents a distribution of threshold voltages of cells that are in an erased state E (storing "11"), having negative threshold voltage levels. Distribution 312 represents a distribution of threshold voltages of cells that are in a first programmed state A, storing "10." Distribution 314 represents a distribution of threshold voltages of cells that are in a second programmed state B, storing "00." Distribution 316 represents a distribution of threshold voltages of cells that are in a third programmed state C, storing "01." Each of the two bits stored in a single memory cell, in this example, is from a different logical page. That is, each bit of the two bits stored in each memory cell carries a different logical page address. The bit displayed in the square corresponds to a lower page. The bit displayed in the circle corresponds to an upper page. In one embodiment, the logical states are assigned to the sequential physical states of memory cells using a gray code sequence so that if the threshold voltage of a floating gate erroneously shifts to its nearest neighboring threshold voltage state range, only one bit will be affected. In order to provide improved reliability, it is preferable for the individual distributions to be tightened (distribution narrowed), because the tighter distribution brings a wider read margin (distance between adjacent state threshold distributions).

Figure 4:
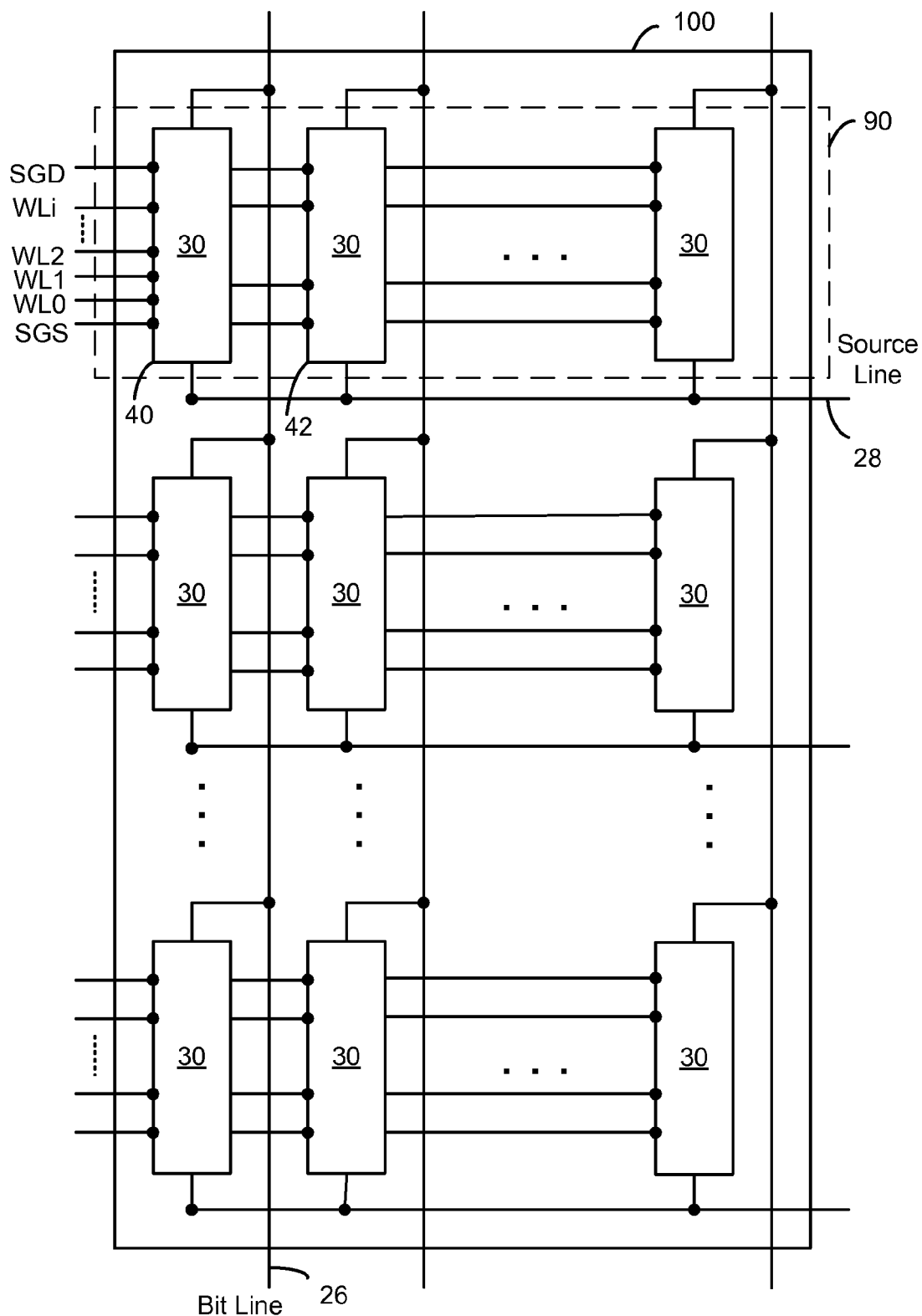
FIG. 4 is a block diagram of an array of NAND flash memory cells.

In read and verify operations, the select gates of a selected block are raised to one or more select voltages and the unselected word lines (e.g., WL0, WL1 and WL3 of FIG. 4) of the selected block are raised to a read pass voltage $V_{READ}$ (e.g. 4.5 volts) to make the transistors operate as pass gates. The selected word line of the selected block (e.g., WL2) is connected to a reference voltage $V_{CGR}$, a level of which is specified for each read and verify operation in order to determine whether a threshold voltage of the concerned memory cell is above or below such level. After applying the word line voltage, the conduction current of the memory cell is measured to determine whether the memory cell turned on in response to the voltage applied to the word line. If the conduction current is measured to be greater than a particular value, then it is assumed that the memory cell turned on and the voltage applied to the word line is greater than the threshold voltage of the memory cell. If the conduction current is not measured to be greater than the particular value, then it is assumed that the memory cell did not turn on and the voltage applied to the word line is not greater than the threshold voltage of the memory cell.

For example, in a read operation of a one bit memory cell as illustrated in FIG. 9, the selected word line WL2 is grounded, so that it is detected whether the threshold voltage is higher than 0V. In a verify operation of a one bit memory cell, the selected word line WL2 is connected to 0.8V, for example, so that as programming progresses it is verified whether or not the threshold voltage has reached 0.8V. The source and p-well are at zero volts during read and verify. The selected bit lines (BLe) are pre-charged to a level of, for example, 0.7V. If the threshold voltage is higher than the read or verify level, the potential level of the concerned bit line (BLe) maintains the high level, because of the associated non-conductive memory cell. On the other hand, if the threshold voltage is lower than the read or verify level, the potential level of the concerned bit line (BLe) decreases to a low level, for example less than 0.5V, because of the conductive memory cell. The state of the memory cell is detected by a sense amplifier of a sense block 200 that is connected to the bit line and senses the resulting bit line voltage. The provided voltages are exemplary only and will vary according to implementation.

There are many ways to measure the conduction current of a memory cell during a read or verify operation. In the above example, the conduction current of the selected memory cell allows (or fails to allow) the NAND string that included the selected memory cell to discharge the bit line. The voltage on the bit line is measured after a period of time to determine whether it has been discharged or not. In another example, the conduction current of a memory cell is measured by the rate it discharges a dedicated capacitor in the sense amplifier.

FIG. 10 shows three read reference voltages, $V_{RA}$, $V_{RB}$ and $V_{RC}$, for reading data from the multi-state memory cells depicted therein. By testing whether the threshold voltage of a given memory cell is above or below $V_{RA}$, $V_{RB}$ and $V_{RC}$, the system can determine what state the memory cell is in. If a memory cell conducts with $V_{RA}$ applied to its control gate, then the memory cell is in state E. If a memory cell conducts at $V_{RB}$ and $V_{RC}$ but not at $V_{RA}$, then the memory cell is in state A. If the memory cell conducts at $V_{RC}$ but not at $V_{RA}$ and $V_{RB}$, then the memory cell is in state B. If the memory cell does not conduct at $V_{RA}$, $V_{RB}$ or $V_{RC}$, then the memory cell is in state C. FIG. 10 also shows three verify reference voltages, $V_{VA}$, $V_{VB}$ and $V_{VC}$. When programming memory cells to state A, the system tests whether those memory cells have a threshold voltage greater than or equal to $V_{VA}$. When programming memory cells to state B, the system will test whether the memory cells have threshold voltages greater than or equal to $V_{VB}$. When programming memory cells to state C, the system will determine whether memory cells have their threshold voltage greater than or equal to $V_{VC}$.

Memory cells are erased in one embodiment by raising the p-well to an erase voltage (e.g., 20 volts) for a sufficient period of time and grounding the word lines of a selected block while the source and bit lines are floating. A strong electric field is thus applied to the tunnel oxide layers of selected memory cells and the data of the selected memory cells are erased as electrons of the floating gates are emitted to the substrate side. As electrons are transferred from the floating gate to the p-well region, the threshold voltage of a selected cell is lowered. Those cells whose erase is to be inhibited have their word lines set to a floating condition. Due to capacitive coupling, the unselected word lines, bit lines, select lines, and common source lines are also raised to a significant fraction of the erase voltage, thus inhibiting erasing of the unselected cells. Erasing can be performed on the entire memory array, separate blocks, or another unit of cells.

Figure 11:
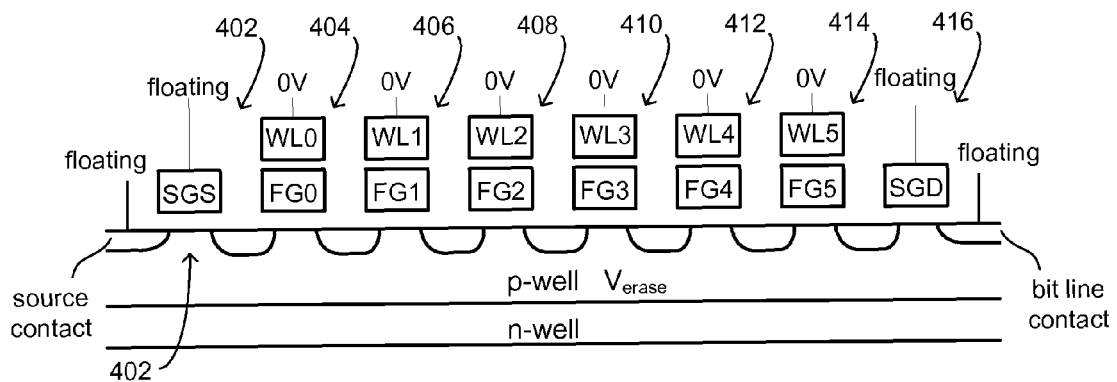
FIG. 11 is a cross-sectional view of a NAND string depicting bias conditions that can be applied for erasing the NAND string.

FIG. 11 depicts exemplary bias conditions for performing an erase operation. The bias conditions are shown as applied to a single NAND string but it will be appreciated that the erase bias conditions can be applied to many NAND strings (e.g., a block of cells) in parallel. Each word line is grounded and while the source line, bit line, source select gate line SGS, and drain select gate line SGD are allowed to float. An erase voltage $V_{ERASE}$ (e.g., 20V) is applied to the p-well. Due to capacitive coupling, the unselected word lines, bit lines, select lines, and source line are also raised to a high positive potential (e.g., 20V). A strong electric field is applied to the tunnel oxide layers of memory cells of a selected block and the data of the selected memory cells is erased as electrons of the floating gates are emitted to the substrate. Erasing refers to lowering the threshold voltage of a memory cell by transferring electrons out of its floating gate. As sufficient electrons are transferred from the floating gate to the p-well region, the threshold voltage of a selected cell becomes negative. Once the threshold voltage reaches a predetermined sufficiently low value, the memory cell can be regarded as erased and the erase process deemed completed or successful. The erase voltage signal $V_{ERASE}$ is typically applied as a series of erase voltage pulses, with an erase verification operation being carried out in between each pulse. If the unit of cells being erased is not verified as erased after application of an erase voltage pulse, another erase voltage pulse can be applied to the p-well region. In some embodiments, the peak value of the erase voltage is increased for each subsequent pulse (e.g., in 1V increments from 16V to 20V).

Figure 12:
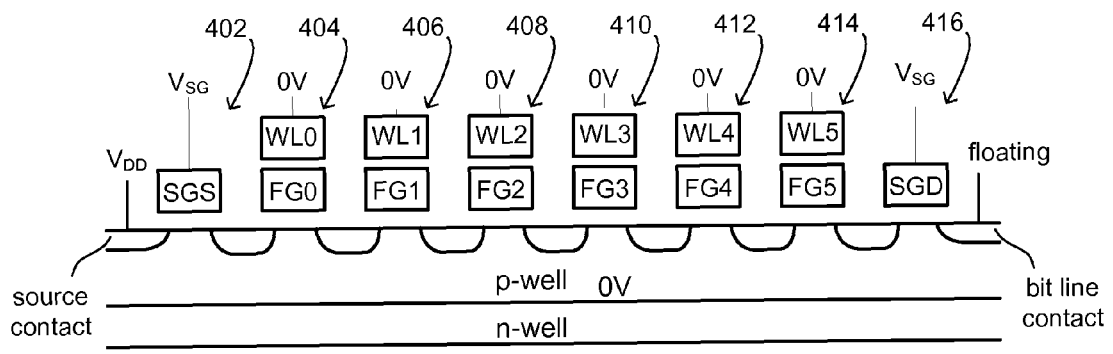
FIG. 12 is a cross-sectional view of a NAND string depicting bias conditions that can be applied to verify the memory cells for an erased state.

FIG. 12 depicts exemplary bias conditions for performing an erase verify operation. Each word line is connected to a low voltage, typically 0V, while turning on each select gate and applying $V_{DD}$ to the common source line. The bit line is initially discharged to 0V and then kept floating during part of the erase verify operation. In this bias condition, if the threshold voltage of each memory cell in the NAND string is lower than 0V (assuming that each word line is connected to 0V), the NAND string will initially be in a conducting state (on state). As a result, the bit line will charge up and the bit line voltage will gradually increase. The amount of increase in the bit line voltage depends on the threshold voltage of the memory cells. The lower the threshold voltage $V_T$ of the memory cells, the higher the bit line voltage will increase. After a certain amount of time in which the bit line is allowed to charge up, the sense-amplifier carries out a sense operation in which the bit line voltage is compared with a pre-determined voltage $V_{SENEV}$. If the bit line voltage is higher than $V_{SENEV}$, the memory cells in the NAND string are considered to be successfully erased, typically with each memory cell of the NAND string having a threshold voltage lower than $V_{SENEV}$. Typically, the verify operation is performed in parallel on the block of cells. Additional erase voltage pulses can be applied until all or almost all the NAND strings are verified as being successfully erased.

Figure 13A:
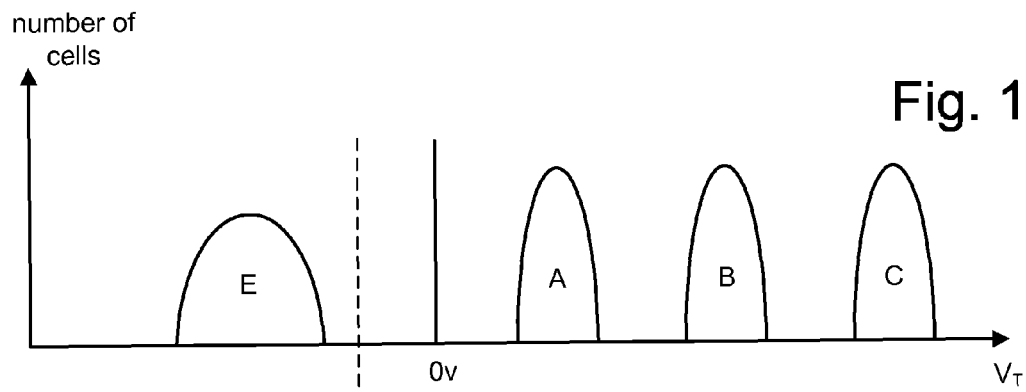
FIGS. 13A and 13B depict the distribution of threshold voltages for a group of memory cells before and after being erased.
Figure 13B:
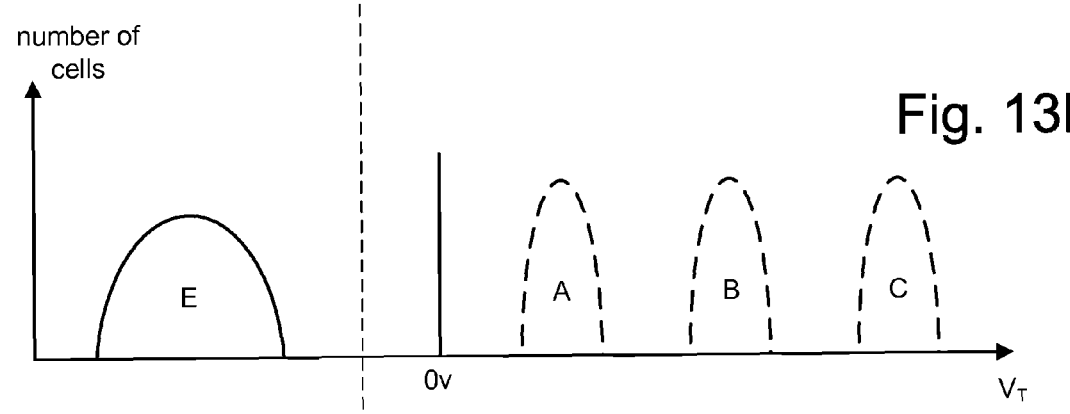

FIG. 13A shows the erased (E) and programmed (A, B, C) threshold voltage $V_T$ distributions of a four state or four level memory device after data has been written into the memory array. FIG. 13B depicts the same four state memory device after an erase operation has been completed. As illustrated, the erase operation has resulted in the distribution of threshold voltages of erased memory cells (which now includes the previously programmed cells) widening and shifting below the $V_{SENEV}$ level. The memory cells are in general erased deeper than required. To guarantee that all or most memory cells can be erased with one erase voltage pulse after a number of write/erase cycles, the selected size of the first erase voltage pulse is generally larger than required to erase all the cells of the fresh device (not having undergone many write/erase cycles) in one pulse. Moreover, the different erase behavior of individual memory cells within a device can lead to some cells being in a more deeply erased state than others, as previously described. For example, faster erasing memory cells may be shifted to a very low negative threshold voltage by virtue of additional erase voltage pulses they are subjected to in order to finish erasing slower cells of the same string.

Figure 14:
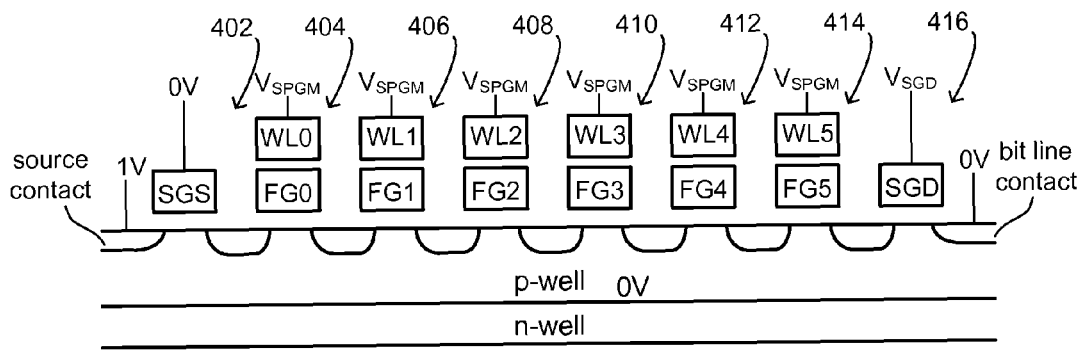
FIG. 14 is a cross-sectional view of a NAND string depicting bias conditions that can be applied to verify the NAND string for sufficient soft programming.

FIG. 14 depicts the bias conditions for a soft programming operation to shift the threshold voltages of erased memory cells closer to the erase verify level. A soft programming operation is typically carried out by applying soft programming pulses $V_{SPGM}$ to all the word lines of a selected block at the same time. The source side select gate 402 is turned off by grounding the source side gate line SGS while applying 0V to the bit line and turning on the drain side select gate 416 by applying $V_{SGD}$ (e.g., 1.8V-3.3V) to the drain side select gate line SGD. Soft programming is generally performed after erasing a set of memory cells to narrow the width of the erased threshold distribution for the set of memory cells and also to normalize the erased threshold distribution of the individual memory cells within the set. Soft programming pulses are lower in amplitude than regular programming pulses (e.g., as shown in FIG. 7) to avoid that the cells reach a programmed state. What is desired as a result of the soft programming is that the cells have a narrower erased threshold voltage distribution. Consequently, the threshold voltages are not intended to be shifted into a programmed state range, but rather, close to the $V_{SENEV}$ level.

After application of each soft programming pulse, a verify operation similar to a typical erase verify operation is performed. The bias conditions depicted in FIG. 12 can be used in one embodiment. Each word line is connected to a low voltage, typically 0V, while turning on each select gate and applying $V_{DD}$ to the common source line. The bit line is initially discharged to 0V and then kept floating during part of the soft program verify operation. After a certain time in which the bit line is allowed to charge up, the sense amplifier carries out a sense operation in which the bit line voltage is compared with the pre-determined voltage $V_{SENEV}$. If the bit line voltage is lower than $V_{SENEV}$, the memory cells are considered to be successfully soft programmed with at least one memory cell in the NAND string having a threshold voltage typically higher than $V_{SENEV}$. Once a certain number of NAND strings in the selected block are verified as being successfully soft programmed, soft programming completes.

Figure 15:
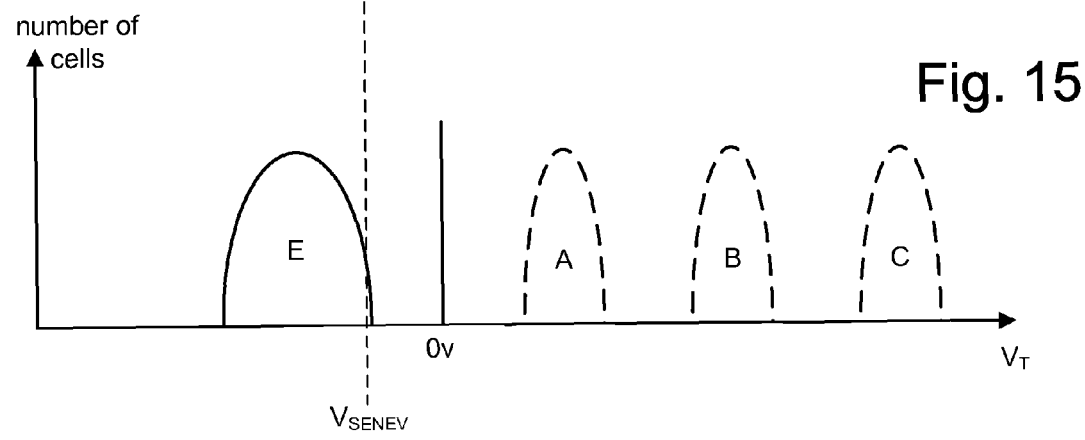
FIG. 15 depicts the distribution of threshold voltages for the group of memory cells of FIGS. 13A and 13B after soft programming.

FIG. 15 depicts the distribution of threshold voltages for the group of memory cells in FIGS. 13A and 13B after undergoing soft programming. The result of soft programming is that the distribution of the erased memory cells in the string shifts up closer to the erase verify level $V_{SENEV}$. Using soft programming, the erase threshold voltage distribution can be shifted up to a level close to the erase verify level, even if the memory cells were originally over-erased.

Figure 16:
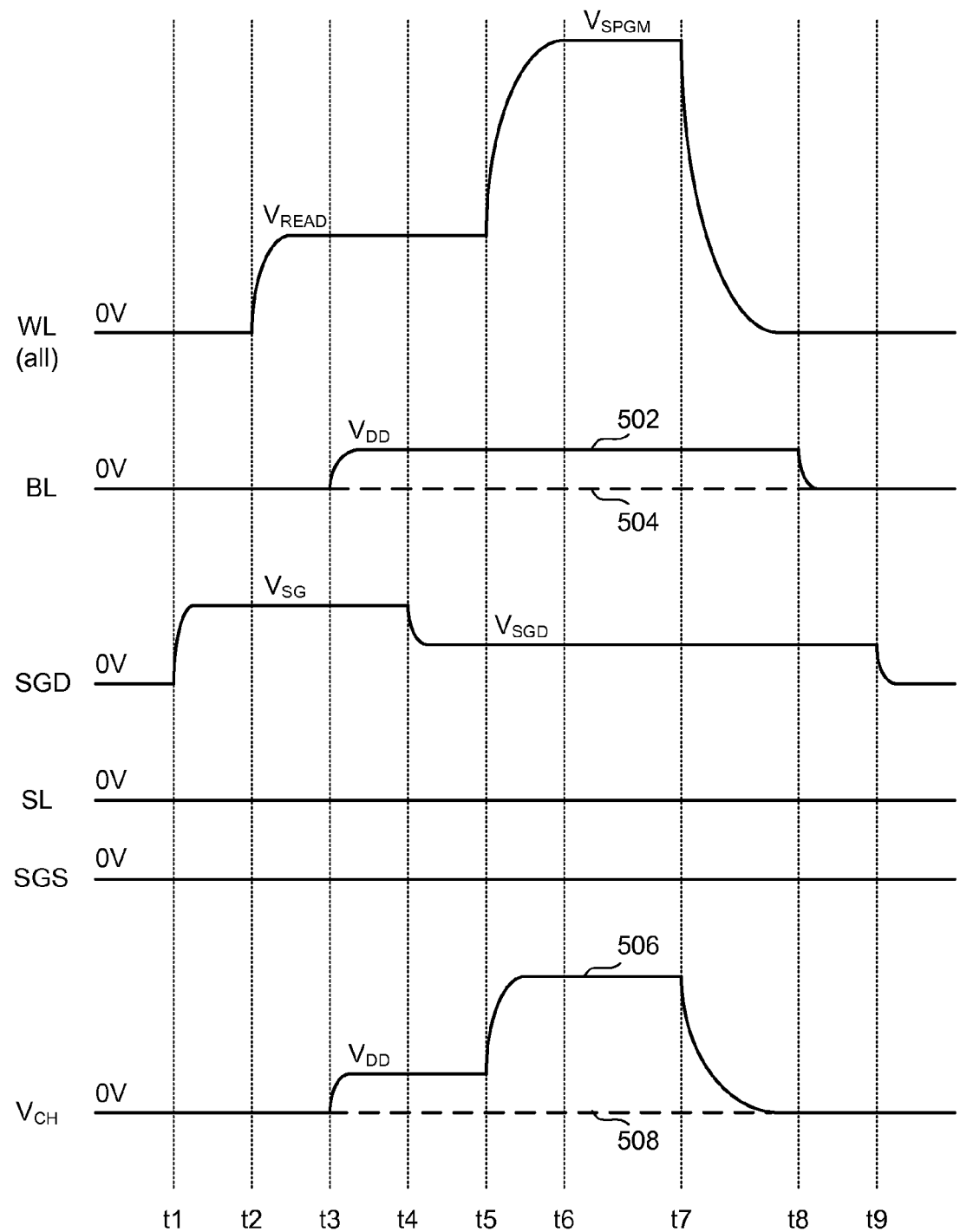
FIG. 16 is a timing diagram depicting selected signals of a non-volatile memory system during soft programming.

FIG. 16 is a timing diagram depicting a typical soft programming operation. The signals applied to the word lines WL (all), bit lines BL, source lines SL, drain select gate lines SGD, and source select gate lines SGS are depicted with the resulting channel voltage $V_{CH}$ in the NAND strings. The common source line SL remains at 0V throughout the operation and the source side select gate is turned off by applying 0V to the source side select gate line SGS. In one embodiment, a small voltage in the range of 1V-1.5V is applied to the common source line SL to improve the cut-off characteristics of the source side select gate. The drain side select gate voltage $V_{DSG}$ is raised to $V_{SG}$ (e.g., 4V) at time $t_1$ to open the drain select gate. At time $t_2$, the word line voltage $V_{WL}$ for all word lines in the block being soft programmed is raised to $V_{READ}$. The voltage level $V_{READ}$ is typically applied to the word lines for soft programming prior to applying the soft programming voltage. $V_{READ}$ is applied to enable pre-charging of the channel regions of those NAND strings that are to be inhibited from soft programming during application of the soft programming voltage. As previously described, $V_{READ}$ is actually a read pass voltage used to ensure unselected transistors are in an one state when reading other transistors. For example, when reading memory cells of a selected word line, $V_{READ}$ will be applied to unselected word lines to turn on each memory cells connected thereto. Typically, $V_{READ}$ is a voltage sufficient to turn on a cell programmed to the highest threshold voltage range.

At time $t_3$, the bit lines for each NAND string of the block are set to a voltage corresponding to whether the particular NAND string is to be soft programmed or is to be inhibited from soft programming. Line 502 represents a NAND string to be inhibited from soft programming and line 504 represents a NAND string that is enabled for soft programming. The NAND string to be inhibited has its bit line BL voltage 502 raised to $V_{DD}$ (e.g., 1.8V-3.3V). The bit line BL voltage 504 of the NAND string to be enabled for soft programming remains at 0V.

The resulting channel region voltage $V_{CH}$ of the inhibited NAND string is depicted by line 506. The resulting channel region voltage $V_{CH}$ of the enabled NAND string is depicted by line 508. With $V_{READ}$ applied to the word lines, and the drain side select gates turned on by the voltage $V_{SG}$, a conduction path is established in each NAND string through each memory cell to the bit line. With the bit line raised to $V_{DD}$ for the inhibited NAND string, the drain side select gate transfers the bit line voltage to the channel region of the NAND string. The voltages applied to the word lines and drain select gate permits the channel region of the inhibited NAND string to be pre-charged to the bit line voltage level of $V_{DD}$. For the NAND string that is enabled for soft programming, the channel region remains at 0V due to the 0V bit line voltage. At time $t_4$, the drain side select gate voltage $V_{DSG}$ is lowered to the level of $V_{SGD}$. The voltage $V_{SGD}$ is lower than the voltage $V_{SG}$ in order to turn off the drain side select gate in those NAND strings that are to be inhibited from soft programming. Thus, at time $t_4$ the channel region of those NAND strings that are being inhibited from soft programming is cut off from the bit line, enabling boosting of those channel regions as hereinafter described. In one embodiment for example, $V_{SGD}$ may be in the range of 1.8V-3.3V while $V_{SG}$ is in the range of 3V-4.5V. The NAND strings that are to be programmed, having 0V at their bit line, will remain on when the drain side select gate voltage $V_{DSG}$ is lowered to $V_{SGD}$. The channel regions remain at 0V and a path is provided to draw electrons to the floating gates of the memory cells when the soft programming voltage is applied. In one embodiment, the drain select gate line SGD can be raised to $V_{SGD}$ at time $t_1$. This will still enable pre-charging in the inhibited NAND strings but the pre-charged level will not rise to the full level of the bit line voltage $V_{DD}$.

At time $t_5$, the soft programming voltage $V_{SPGM}$ is applied to each word line of the block being soft programmed. The channel region of those NAND strings being inhibited from soft programming rises in accordance with the increase in the word line voltage from the level $V_{READ}$ to the level $V_{SPGM}$, as indicated by line 506. This boosting of the channel region inhibits soft programming of the memory cells of those NAND strings under application of the large positive bias at the corresponding word lines. The channel region of NAND strings enabled for soft programming, represented by line 508, remains at 0V when the word line voltages are raised to the level $V_{SPGM}$. With the channel regions at 0V and a large positive bias at the word lines, these memory cells will undergo soft programming by injecting electrons in the floating gates of those memory cells. At time $t_7$, the soft programming voltage $V_{SPGM}$ is lowered on each word line back to 0V. The channel region of the inhibited NAND strings will also fall to about 0V. At time $t_8$, the bit line voltages for the inhibited NAND strings are lowered back to 0V. The drain side select gates are turned off at time $t_9$ by applying 0V.

Soft programming is typically carried out simultaneously on a block of memory cells sharing a common set of word lines. After applying the soft programming pulse to each of the word lines of the block as depicted in FIG. 16, a verification operation is performed under the bias conditions depicted in FIG. 12. Those NAND strings that pass the verification operation will be inhibited from further soft programming by raising their bit line to VDD during subsequent soft programming voltage applications. NAND strings that do not successfully pass the verify operation undergo further soft programming.

Figure 17:
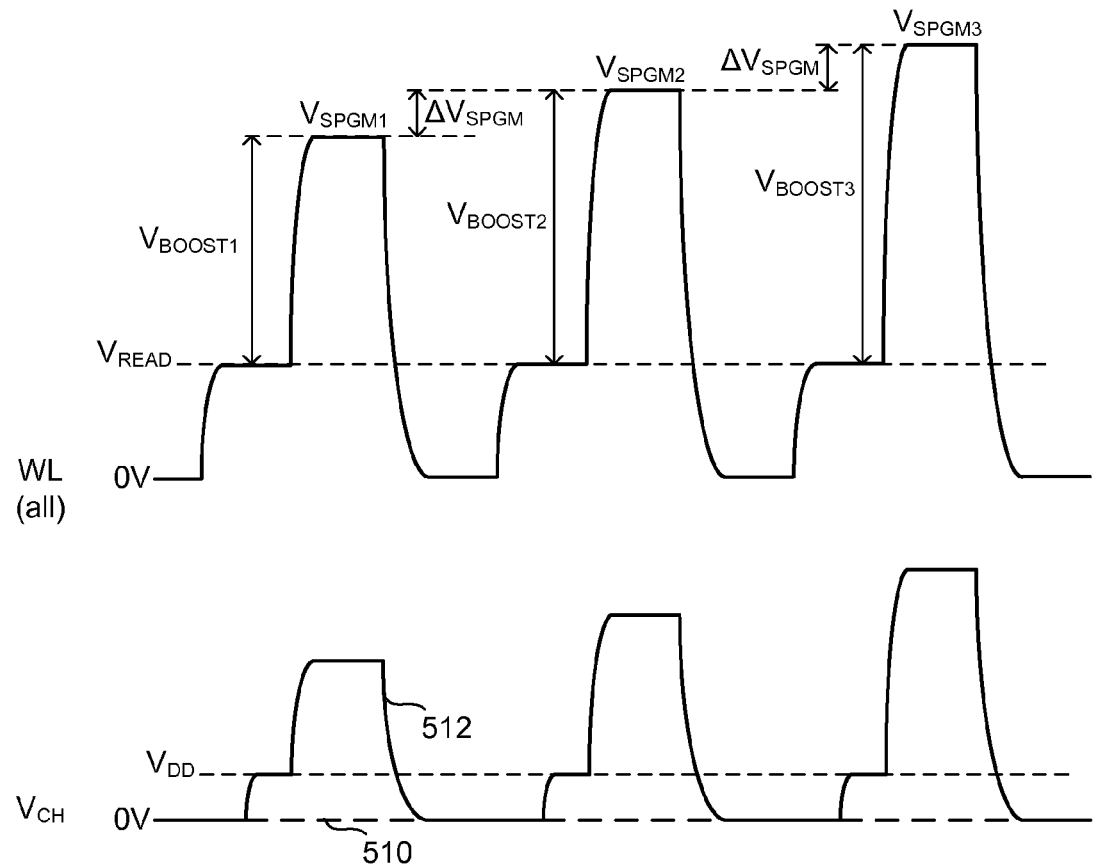
FIG. 17 depicts a series of soft programming voltage pulses and the resulting boosted voltage level of exemplary NAND strings.

FIG. 17 shows a series of soft programming voltage pulses that may be applied to a set of word lines in order to program a number of NAND strings of a block of memory cells. The resulting channel region voltage $V_{CH}$ of an inhibited NAND string (having $V_{DD}$ at its bit line) is depicted by line 512 and the channel region voltage $V_{CH}$ of an enabled NAND string (having 0V at its bit line) is depicted by line 510. Each soft programming voltage pulse includes two discrete peak voltage levels. The first soft programming voltage pulse is generated by applying the read pass voltage $V_{READ}$ to the word lines followed by the soft programming voltage at a level $V_{SPGM1}$. The bit line voltage $V_{DD}$ is transferred to the channel region of the inhibited NAND string when $V_{READ}$ is applied to the word lines. When the word line voltage is raised to $V_{SPGM1}$, the channel region is boosted in proportion to the amount of $V_{BOOST1}$. $V_{BOOST1}$ is equal to the difference between the soft programming voltage level $V_{SPGM1}$ and the read pass voltage level $V_{READ}$. The channel region voltage rises from the level of $V_{DD}$ in proportion to $V_{BOOST1}$. The channel region voltage of the enabled NAND string 510 is not boosted and remains at 0V to enable soft programming. The boosted channel voltage is proportional to $V_{BOOST1}$, but not necessarily in a linear fashion. Leakage currents, due to such factors as Gate Induced Drain Leakage and other mechanisms may discharge the channel, affecting the dependence of channel boosting on $V_{BOOST1}$.

The read pass voltage $V_{READ}$ is again applied to the word lines for the second soft programming voltage pulse. The channel region of the inhibited NAND string is pre-charged to $V_{DD}$. The soft programming voltage is then applied to the word lines at a second level $V_{SPGM2}$ generating a boosting level of $V_{BOOST2}$. With an increase in the soft programming voltage level, the level of channel boosting in the inhibited NAND strings increases. The read pass voltage is the same for the second pulse but the soft programming voltage has increased. Consequently, the level of channel boosting in the inhibited NAND string increases in proportion to the increase from $V_{BOOST1}$ to $V_{BOOST2}$.

A third soft programming voltage pulse is then applied, beginning with an application of $V_{READ}$ to pre-charge the channel of the inhibited string to $V_{DD}$. The soft programming voltage is then applied at a third level $V_{SPGM3}$, creating a third level of boosting $V_{BOOST3}$. The channel of the of the inhibited NAND string is boosted by a third amount proportional to $V_{BOOST3}$.

If the boosted channel voltage in an inhibited NAND string becomes too large, the soft programming operation may be adversely affected. During soft programming, the gate of the source side select gate transistor is grounded (e.g., source select transistor 402 in FIG. 14). The soft programming voltage pulse boosts the channel region of an inhibited NAND string to a relatively high voltage (e.g., 5V-10V). As the soft programming voltage is increased, the amount of boosting is increased. If the level of boosting in the channel region becomes too high, breakdown of this select gate transistor can occur. The boosted channel voltage is present at the drain side of the select gate transistor. With 0V at the transistor's gate region, and a large voltage at its drain region, breakdown can occur. One possible cause for the breakdown is band to band tunneling in the drain area of the select gate transistor, also commonly referred to as Gate Induced Drain Leakage or GIDL. Electrons generated by GIDL can be accelerated towards the boosted channel area under the memory cell at word line WL0. This can cause so called hot electrons that may subsequently be injected into the floating gate of the memory cell at word line WL0, causing an undesirable threshold voltage shift and soft programming disturb.

GIDL may also occur at the drain area of the memory cell in a NAND string that is next to the drain side select gate, such as memory cell 414 at word line WL5, adjacent to the drain select gate transistor 416. Even though the drain side select gate typically has a higher gate voltage, such as in the range of 1.5V-2.5V during boosting, GIDL may still occur with a high boosted level in the channel of the inhibited NAND string.

Figure 1:
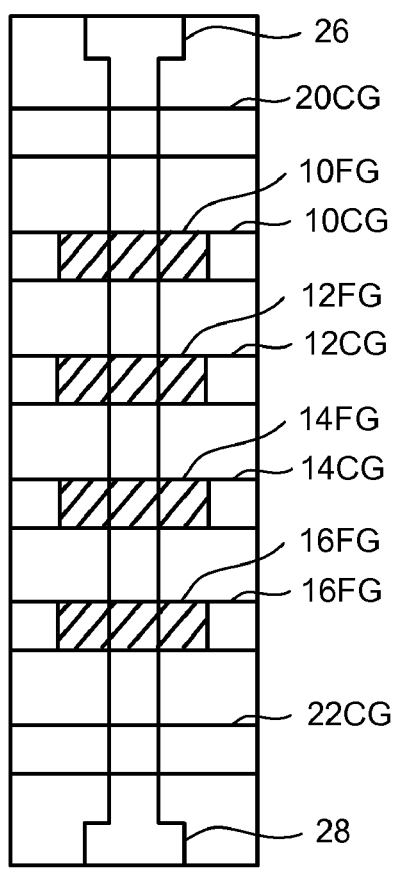
FIG. 1 is a top view of a NAND string.
Figure 2:
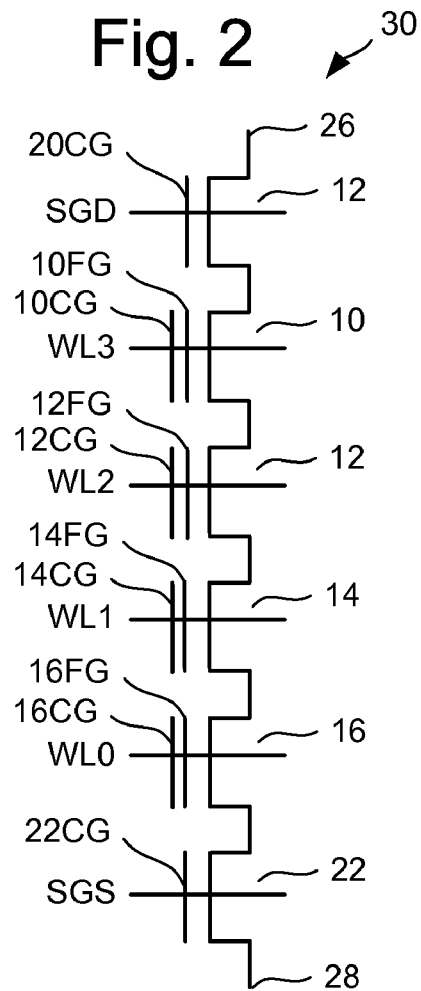
FIG. 2 is an equivalent circuit diagram of the NAND string of FIG. 1.
Figure 3:
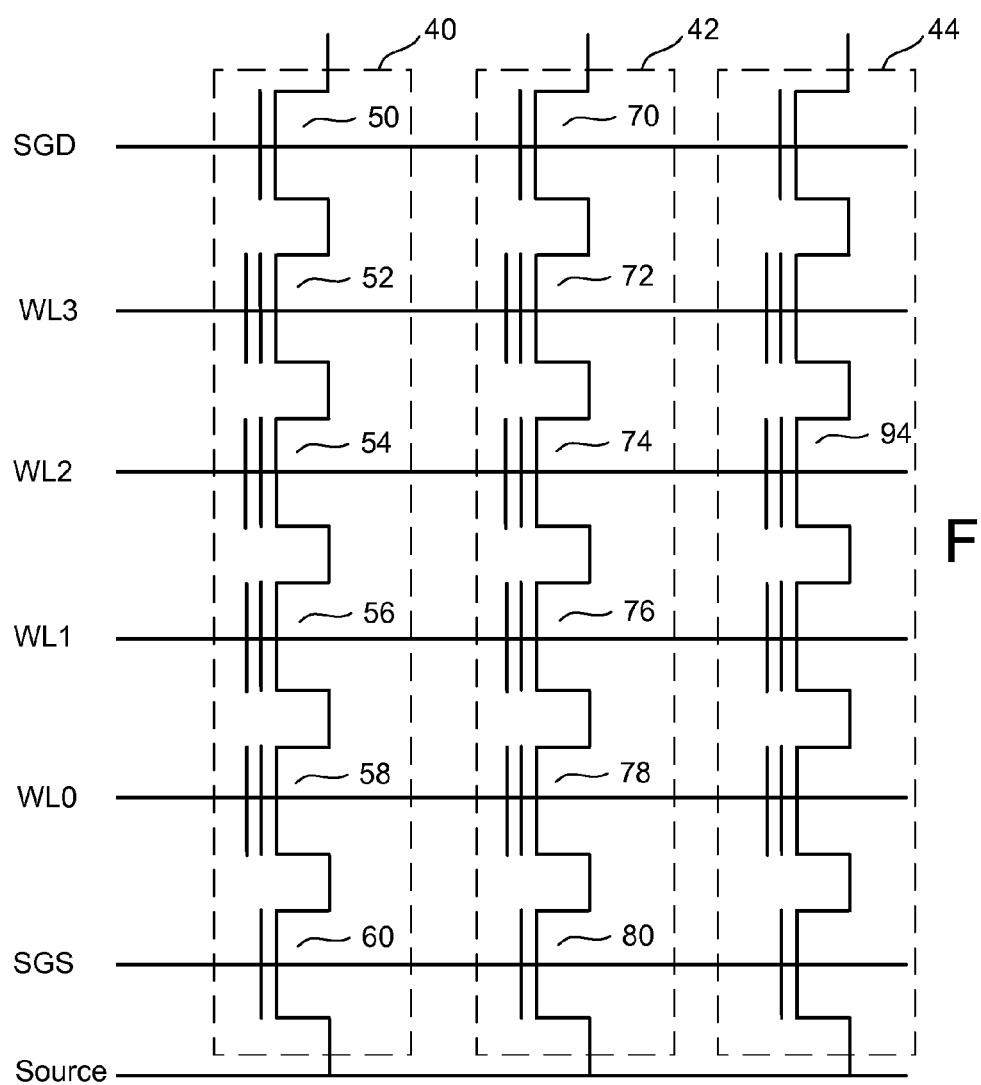
FIG. 3 is a circuit diagram depicting three NAND strings.

It is also possible that GIDL can cause the boosted channel area of the memory cell adjacent to the select gate transistor (e.g., memory cell 404) at word line WL0, as well as the channel area of other memory cells in the NAND string, to discharge. If the boosted voltage level in the inhibited NAND string discharges, the channel potential can decrease and soft program disturb may occur. Soft program disturb refers to the unintentional soft programming of a memory cell. If the channel potential decreases to a sufficient extent, the soft programming voltage may cause electrons to be injected into the memory cells of an unselected string. Referring to FIG. 3 for example, if NAND string 42 is to be inhibited from soft programming but experiences a decrease in its channel potential during application of the soft programming voltage to word lines WL0-WL3, memory cells 72, 74, 76, and 78 may inadvertently be soft programmed.

Figure 18:
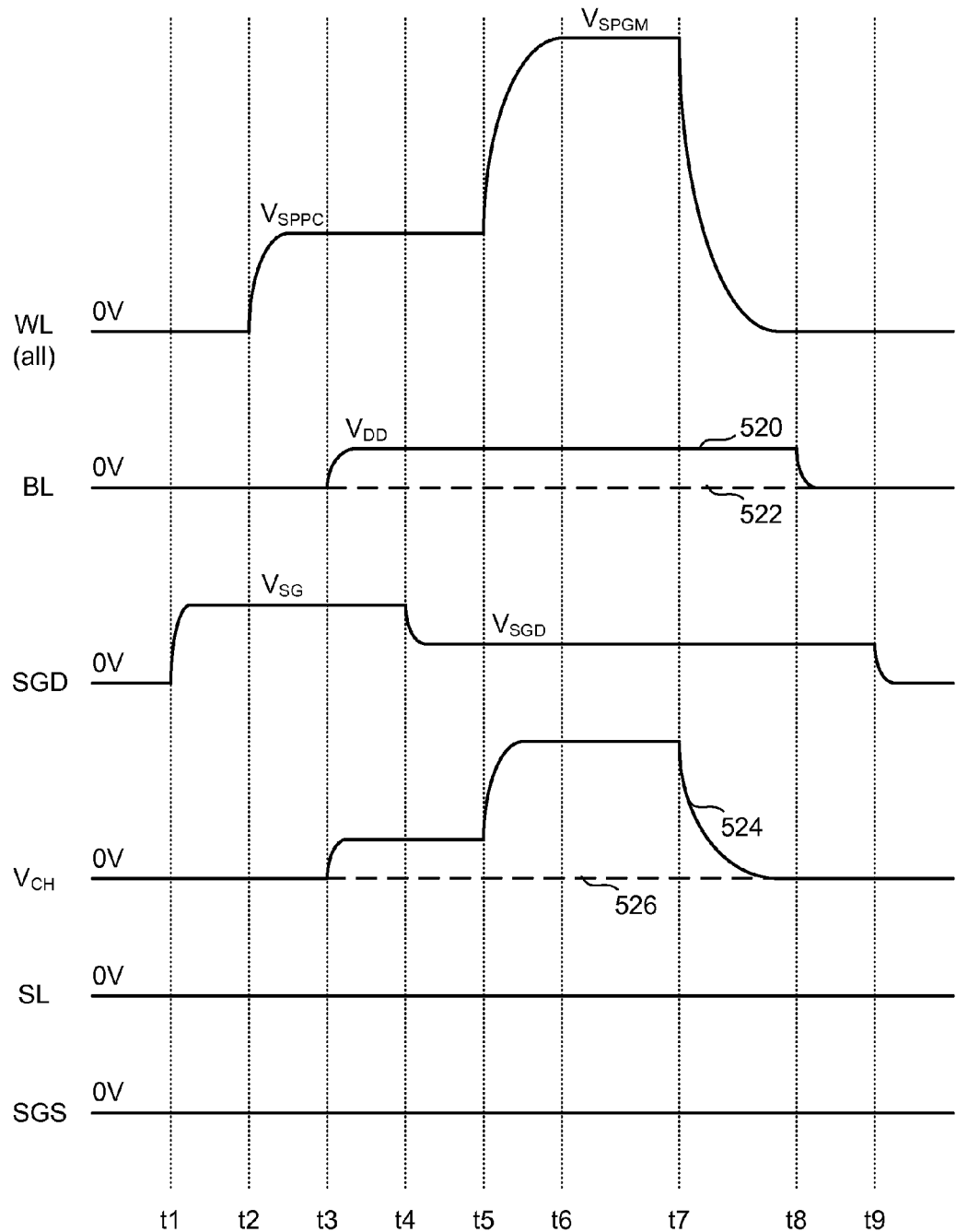
FIG. 18 is a timing diagram depicting selected signals of a non-volatile memory system during soft programming in accordance with one embodiment.

Because prior soft programming techniques have relied on a single read pass voltage $V_{READ}$ for pre-charging, the amount of boosting in the channel of an inhibited NAND string has not been controllable. As the soft programming voltage $V_{SPGM}$ is increased, the level of boosting in the inhibited NAND strings increases because the value of $V_{READ}$ remains the same. As device dimensions continue to be scaled, these higher levels of boosting can be expected to generate increased levels of soft programming disturb, especially for the memory cells on word lines next to the select gates, Embodiments in accordance with the present disclosure provide a soft programming pre-charge voltage in order to control the amount of boosting in inhibited NAND strings during soft programming. FIG. 18 is a timing diagram in accordance with one embodiment for soft programming a block or other unit of memory cells. The source side select gate line and common source line remain at 0V throughout the soft programming operation. As mentioned above, a voltage in the range of 1V-1.5V can be used for the source line to improve the cutoff characteristics of the source side select gate. At time $t_1$, the drain side select gate is opened by applying $V_{SG}$ to the select gate drain line SGD. At time $t_2$, a soft programming pre-charge voltage $V_{SPPC}$ is applied to each word line of the selected block. In one embodiment, the soft programming pre-charge voltage is in the range of about 5V-10V. However, other values may be used in other implementations to achieve the desired boosting characteristics as hereinafter described. This should be contrasted with the technique of the prior art depicted in FIGS. 16-17, where a read pass voltage $V_{READ}$ is applied to the word lines at time $t_2$. The voltage $V_{READ}$ is typically in the range of about 4.5V-5.5V. More importantly, a fixed value is used for $V_{READ}$, based on the desired level for turning on unselected memory cells during reading, not to achieve appropriate levels of channel boosting during soft programming. Because of its low, fixed level, an increase in the boosted channel voltage of inhibited NAND strings occurs as the soft programming voltage is increased as additional pulses are applied.

By utilizing a soft programming pre-charge voltage $V_{SPPC}$, embodiments in accordance with the present disclosure can control the level of boosting in an inhibited NAND string. At time $t_3$, the bit lines of NAND strings to be inhibited from soft programming are raised to the voltage $V_{DD}$. The bit lines of the NAND strings to be soft programmed remain at 0V. The channel regions of the to be inhibited NAND strings are pre-charged at time $t_3$ in accordance with the voltage level supplied to the bit line. The voltage $V_{DD}$ at the bit line of an inhibited string is transferred by the select gate into the string's channel region. Those strings to be soft programmed have 0V transferred into their channel region.

At time $t_4$, the drain side select gate voltage is lowered to the level $V_{SGD}$ to cut off the select gates for those NAND strings to be inhibited from soft programming while maintaining the drain side select gate in an on state for those NAND strings that are to undergo soft programming. With $V_{DD}$ at the bit line and a lower voltage on the drain side select gate, the to be inhibited NAND strings will be cut off from the bit line. With 0V at the bit line of the NAND strings undergoing soft programming the select gate remains on connecting the channel to the bit line. At time $t_5$, the soft programming voltage $V_{SPGM}$ is applied to all the word lines of the selected block. The channel region of the inhibited NAND strings rises in accordance with the difference between $V_{SPGM}$ and $V_{SPPC}$. The channel regions of the other NAND strings remain at 0V, thus enabling soft programming of their memory cells. Electrons are transferred from the channel region into the floating gates of those memory cells under application of the positive bias on the word lines. In the inhibited NAND strings, the soft programming voltage $V_{SPGM}$ enables channel boosting to inhibit soft programming.

Figure 19:
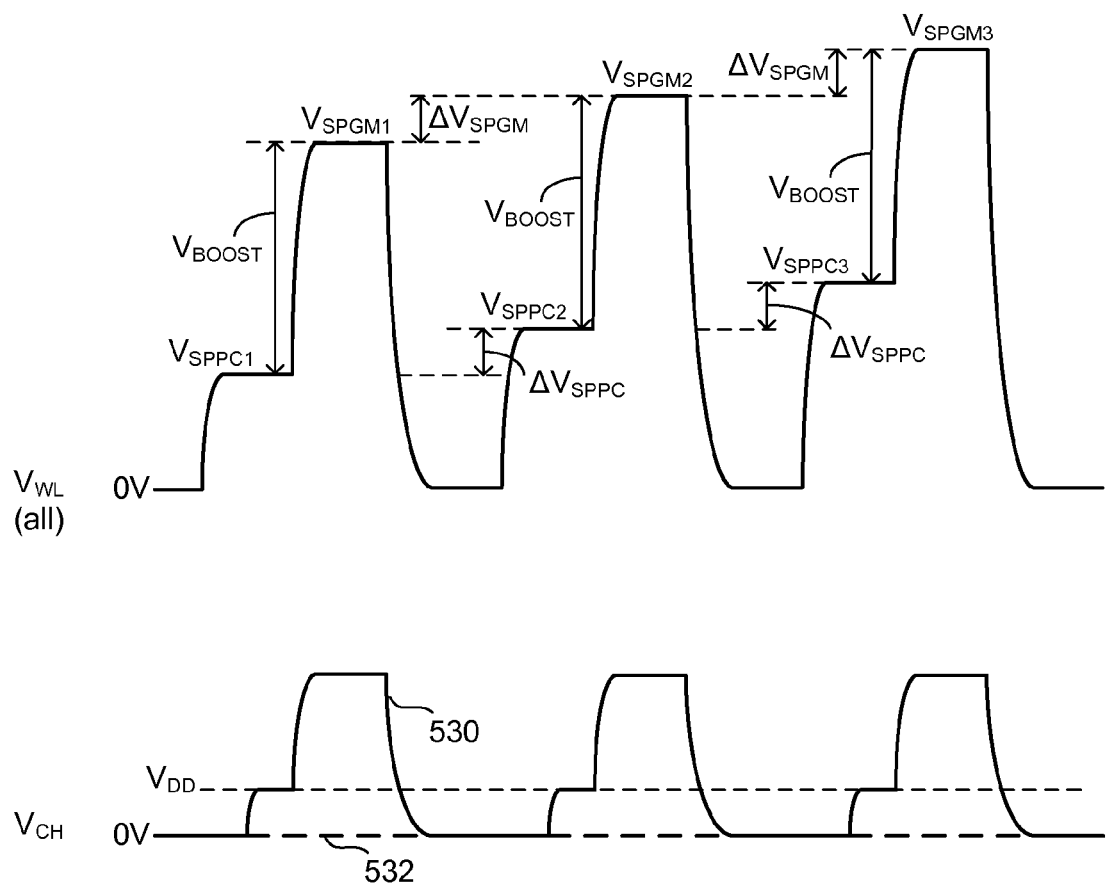
FIG. 19 depicts a series of soft programming voltages in accordance with one embodiment and the resulting boosted voltage of a NAND string enabled for soft programming and a NAND string inhibited from soft programming.

FIG. 19 depicts a series of soft programming voltage pulses applied to a group of word lines in accordance with one embodiment of the present disclosure. The resulting channel voltages $V_{CH}$ in an inhibited NAND string and enabled NAND string are shown by lines 530 and 532, respectively. A soft programming pre-charge voltage $V_{SPPC}$ as was shown in FIG. 18 is utilized in the embodiment of FIG. 19. A first soft programming pulse is generated by initially applying the soft programming pre-charge voltage at a first level $V_{SPPC1}$. After setting each bit line to an inhibit or enable condition and lowering the drain select gate voltage, the soft programming voltage is applied to each word line at a level of $V_{SPGM1}$. The level of boosting in the channel region of the inhibited NAND strings is determined by the difference $V_{BOOST}$ between the first soft programming voltage level $V_{SPGM1}$ and the first soft programming pre-charge level $V_{SPPC1}$. The level of channel boosting in the inhibited NAND string will be increased from the initial value of $V_{DD}$ by an amount proportional to $V_{BOOST}$.

The second soft programming pulse depicted in FIG. 19 is generated by first applying the soft programming pre-charge voltage at a level $V_{SPPC2}$. The level of the soft programming pre-charge voltage is increased from the first level $V_{SPPC1}$ by $\Delta V_{SPPC}$. The soft programming voltage is then applied to each word line at a second level $V_{SPGM2}$. The soft programming voltage is increased by $\Delta V_{SPGM}$ from the first level $V_{SPGM1}$. $\Delta V_{SPGM}$ is substantially equal to $\Delta V_{SPPC}$. Thus, the difference $V_{BOOST}$ between $V_{SPGM2}$ and $V_{SPPC2}$ is substantially equal to the difference $V_{BOOST}$ between $V_{SPGM1}$ and $V_{SPPC1}$. Accordingly, a consistent amount of boosting in the channel region of the inhibited NAND string is achieved as is shown by line 530. During the application of the second soft programming voltage pulse the channel region of the inhibited NAND string will be boosted from the pre-charge level of $V_{DD}$ by an amount roughly equal to the amount achieved by applying the first soft programming pulse.

A third soft programming pulse is generated by first applying the soft programming pre-charge voltage at a level $V_{SPPC3}$ and then applying the soft programming voltage at a level $V_{SPGM3}$. The soft programming pre-charge voltage is increased by $\Delta V_{SPPC}$ and the soft programming voltage is increased by $\Delta V_{SPGM}$. Since $\Delta V_{SPPC}$ and $\Delta V_{SPGM}$ are substantially equal, a level of boosting is again achieved in the inhibited NAND string that is proportional to $V_{BOOST}$, and thus, substantially equal to the previous levels of boosting.

In one embodiment, $\Delta V_{SPGM}$ and $\Delta V_{SPPC}$ are not equal values. Thus, the amount of boosting in the channel region of an inhibited will not be consistent from pulse to pulse. For example, $\Delta V_{SPGM}$ may be larger than $\Delta V_{SPPC}$ which will increase the channel boosting for subsequent pulses. Nevertheless, because a controllable soft programming pre-charge voltage $V_{SPPC}$ is used, proper boosting levels can be achieved. In one embodiment, one or more of the values $\Delta V_{SPGM}$ and $\Delta V_{SPPC}$ can change during soft programming to increase the soft programming voltage or soft programming pre-charge voltage by different amounts from iteration to iteration.

Figure 20:
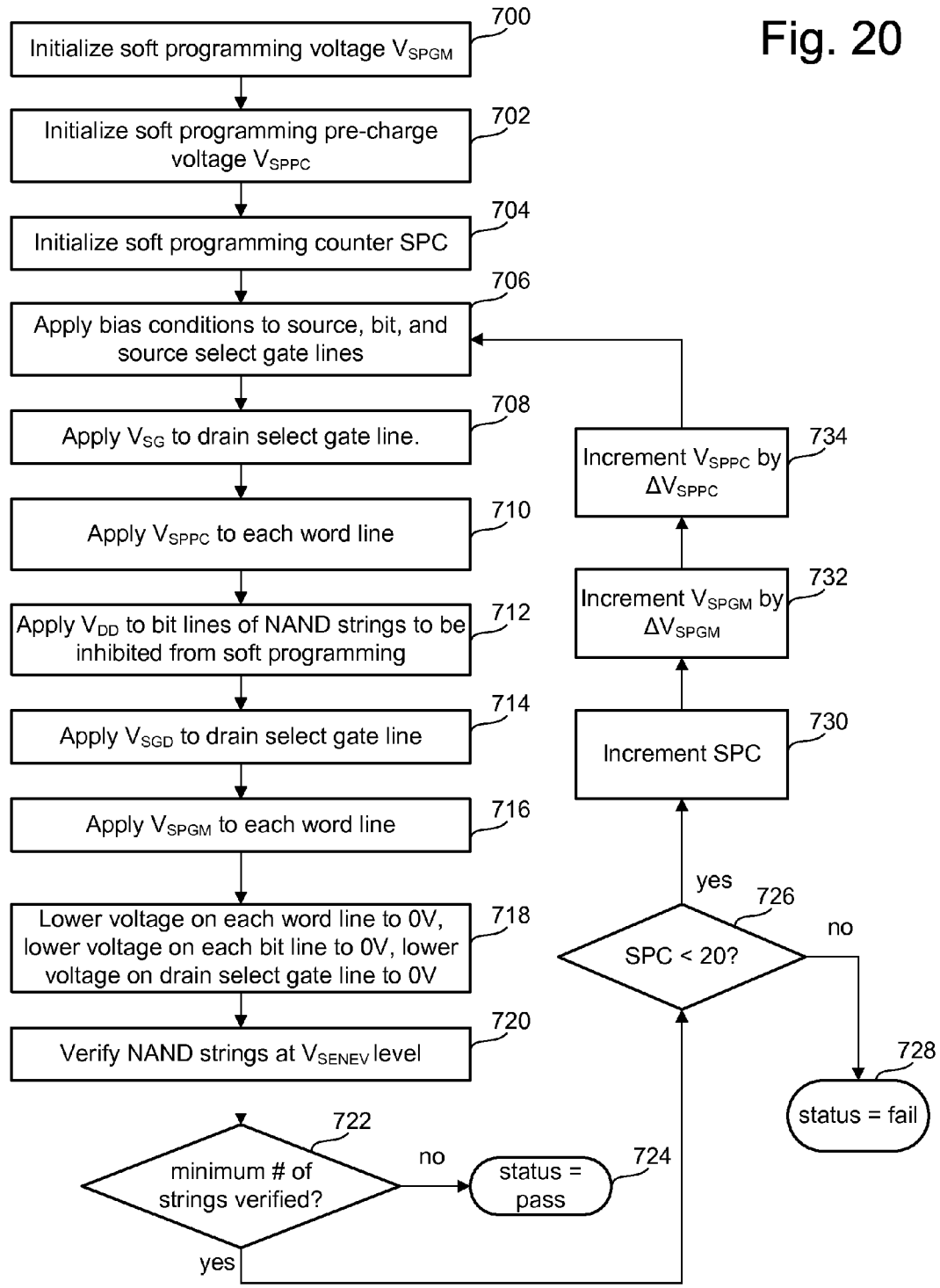
FIG. 20 is a flowchart depicting a technique for soft programming non-volatile memory in accordance with one embodiment.

FIG. 20 is a flowchart of a method for soft programming a unit of memory cells (e.g., a block) in accordance with one embodiment of the present disclosure. The soft programming method can be performed after first erasing the unit of memory cells in one embodiment. In one embodiment, the method can be performed at step 202 of FIG. 8 although erasing and soft programming can be performed independently of programming. At step 700, the soft programming voltage $V_{SPGM}$ is initialized to its starting value. The soft programming pre-charge voltage $V_{SPPC}$ is initialized at step 702 to its starting value. A soft programming counter SPC is initialized to a starting value at step 704. The soft programming counter SPC is used to limit the number of attempts at soft programming the group of cells. At step 706, the bit lines and source select gate lines of the block of cells are grounded while a low voltage of 1V-1.5V is typically applied to the source line. At step 708, the voltage $V_{SG}$ (e.g., 3V-4.5V) is applied to the drain select gate line to turn on the drain select gates for each NAND string of the block.

At step 710 the soft programming pre-charge voltage $V_{SPPC}$ is applied to each word line of the selected block at its starting value. Referring to FIG. 19 for example, step 710 may include applying the soft programming pre-charge voltage at the level $V_{SPPC1}$ during the first iteration of the method. At step 712, the voltage $V_{DD}$ (e.g., 1.8V-3.3V) is applied to the bit lines of each NAND string to be inhibited from soft programming. Typically, during a first iteration of the method all of the NAND strings will be enabled for soft programming. At step 714, $V_{SGD}$ (e.g., 1.8V-3.3V) is applied to the drain select gate line. By lowering the drain select gate line from $V_{SG}$ to $V_{SGD}$, any NAND strings having $V_{DD}$ applied to the bit lines at step 712 will be disconnected from the bit line by lowering the drain select gate voltage to cut off the drain select gates. Those NAND strings with a bit line voltage of 0V will remain in contact with their bit line since their drain select gate will stay on with $V_{SGD}$ at their gate. At step 716, the soft programming voltage is applied to each word line at its starting level. Referring again to FIG. 19, step 716 can include applying the first soft programming voltage level $V_{SPGM1}$ to each word line of the selected block. Together, steps 710 and 716 comprise the application of a single soft programming voltage pulse to each of the word lines of a selected block as illustrated in FIG. 19. At step 718, the voltage on each word line is lowered back to 0V, followed by lowering the voltage on each bit line to 0V, and then the voltage on the drain select gate line to 0V.

At step 720, a soft programming verify operation is performed to determine which of the NAND strings have been successfully soft programmed. In one embodiment, step 720 includes applying the bias conditions of FIG. 12. Each word line is connected to a low voltage, typically 0V, while turning on each select gate and applying $V_{DD}$ to the common source line. The bit line is initially discharged to 0V and then kept floating during part of the soft program verify operation. After a certain time in which the bit line is allowed to charge up, the sense amplifier carries out a sense operation in which the bit line voltage is compared with the pre-determined voltage $V_{SENEV}$. If the bit line voltage is lower than $V_{SENEV}$, the memory cells are considered to be successfully soft programmed with at least one memory cell in the NAND string having a threshold voltage typically higher than $V_{SENEV}$.

At step 722, it is determined if the number of NAND strings that have been successfully verified for soft programming is greater than a predetermined minimum number. If so, a status of pass is reported for the soft programming operation at step 724. If not, the soft programming counter SPC is checked against a maximum limit value (e.g., 20). If the soft programming counter is less than this predetermined maximum value, soft programming continues at step 730. If the soft programming counter has reached the predetermined maximum number of iterations, a status of fail for the soft programming operation is reported at step 728.

At step 730, the soft programming counter is incremented by one. At step 732, the soft programming voltage $V_{SPGM}$ is incremented by $\Delta V_{SPGM}$. For example, the soft programming voltage may be incremented from a first level $V_{SPGM1}$ to a second level $V_{SPGM2}$ as illustrated in FIG. 19. At step 734, the soft programming pre-charge voltage $V_{SPPC}$ is incremented by $\Delta V_{SPPC}$. For example, the soft programming pre-charge voltage may be incremented from a first level $V_{SPPC1}$ to $V_{SPPC2}$ as illustrated in FIG. 19. Although FIG. 19 depicts $\Delta V_{SPGM}$ equal to $\Delta V_{SPPC}$, in other embodiments they may not be equal. Moreover, the soft programming pre-charge voltage is not incremented at all in one embodiment as hereinafter described. In another embodiment, the soft programming pre-charge voltage is not incremented after each soft-programming pulse, but after every other pulse or some other interval. One implementation can include not incrementing the soft programming pre-charge voltage for a number of initial pulses, as the boosted channel may still be low enough that incrementing is not necessary. After the number of initial pulses, incrementing the soft programming pre-charge voltage can begin. After incrementing the soft programming voltage and the soft programming pre-charge voltage, the method returns to step 706 to begin application of a second soft programming voltage pulse at the higher soft programming pre-charge voltage and soft programming voltage levels.

Figure 21:
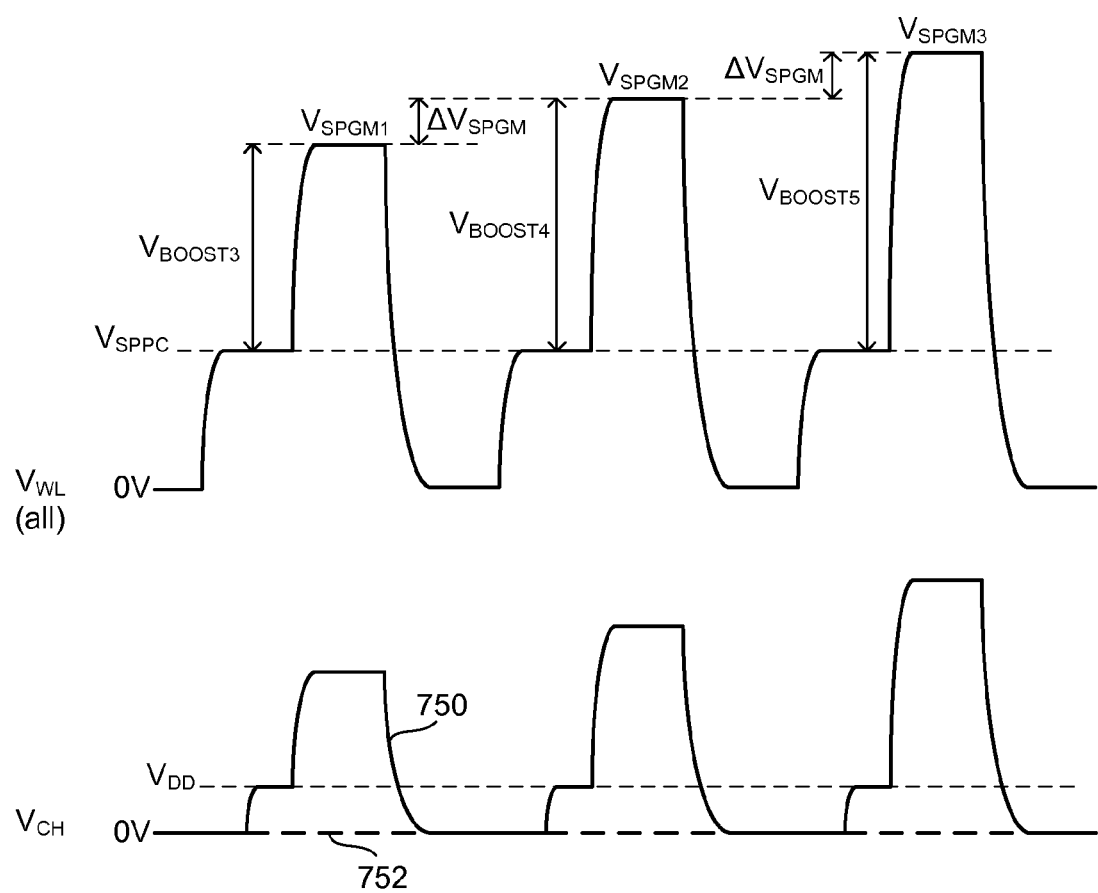
FIG. 21 depicts a series of soft programming voltage pulses in accordance with one embodiment and the resulting boosted voltage of a NAND string enabled for soft programming and a NAND string inhibited from soft programming.

One embodiment of the present disclosure maintains the soft programming pre-charge voltage at a constant level for each soft programming voltage pulse. In FIG. 21, a single value for the soft programming pre-charge voltage $V_{SPPC}$ is used. The soft programming voltage $V_{SPGM}$ is incremented as previously described. The first soft programming voltage pulse is generated by applying the soft programming pre-charge voltage at a level $V_{SPPC}$ and the soft programming voltage at a level $V_{SPGM1}$. The difference in $V_{SPGM}$ and $V_{SPPC}$ is $V_{BOOST3}$ creating a level of channel boosting in inhibited strings that is proportional thereto. A second soft programming voltage pulse is generated by applying the soft programming pre-charge voltage at the same level $V_{SPPC}$, followed by the soft programming voltage at a level $V_{SPGM2}$. The difference in $V_{SPGM2}$ and $V_{SPPC}$ creates a second level of channel boosting proportional to $V_{BOOST4}$. A third soft programming voltage pulse is created by applying the soft programming pre-charge voltage at the level $V_{SPPC}$ followed by the soft programming at a level $V_{SPGM3}$. The difference in $V_{SPGM3}$ and $V_{SPPC}$ creates a third level of channel boosting proportional to $V_{BOOST5}$.

The amounts of boosting created by these three soft programming voltage pulses are depicted as $V_{BOOST3}$, $V_{BOOST4}$, $V_{BOOST5}$ in order to contrast them with the levels of boosting of the prior art depicted in FIG. 17. Because a soft programming pre-charge voltage $V_{SPPC}$ is utilized rather than read pass voltage $V_{READ}$, the amount of boosting can be controlled in the embodiment of FIG. 23. By controlling the amount of boosting based on the value of the soft programming pre-charge voltage, large boosted potentials that may lead to gate induced drain leakage within a NAND string that is being inhibited from soft programming can be avoided.

In one embodiment, the level(s) of the soft programming pre-charge voltage can be determined based on characterization of one or more manufactured devices during testing. For example, in one embodiment the soft programming pre-charge voltage is selected based on an individual device. A device can undergo testing as part of the manufacturing process. Based on that testing, an optimal value of the soft programming pre-charge voltage can be selected. This can be performed in one embodiment by determining at what level of the soft programming pre-charge voltage program disturb or gate induced drain leakage begins to occur within a NAND string. By observing these levels, an optimal value of the soft programming pre-charge voltage that can achieve adequate boosting while avoiding disturb and other problems can be achieved. In another embodiment, the soft programming pre-charge voltage can be based on characterization of a group of devices. For example, many devices can be tested as previously described and an optimal value based on an average of all of these devices selected.

The foregoing detailed description has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method of soft programming non-volatile memory, comprising:
applying a first voltage to a set of word lines to enable pre-charging of a first set of non-volatile storage elements coupled to said set of word lines, said first voltage is different from a read pass voltage;
while said first voltage is applied to each word line in said set of word lines, applying an inhibit voltage to a bit line for said first set of non-volatile storage elements to pre-charge a channel region of said first set of non-volatile storage elements; and
while said inhibit voltage is applied to said bit line for said first set of non-volatile storage elements, applying a second voltage to said set of word lines to soft program a second set of non-volatile storage elements coupled to said set of word lines, said second voltage is higher than said first voltage.

2. The method of claim 1, further comprising:
verifying that said second set of non-volatile storage elements is not soft programmed after applying said second voltage;
applying a third voltage to said set of word lines to enable pre-charging of said first set of non-volatile storage elements, said third voltage is higher than said first voltage;
while said third voltage is applied to each word line in said set of word lines, applying said inhibit voltage to said bit line for said first set of non-volatile storage elements to pre-charge said channel region of said first set of non-volatile storage elements; and
while said inhibit voltage is applied to said bit line for said first set of non-volatile storage elements, applying a fourth voltage to said set of word lines to soft program said second set of non-volatile storage elements, said fourth voltage is higher than said second voltage.

3. The method of claim 2, wherein:
a difference between a level of said fourth voltage and a level of said third voltage is equal to a difference between a level of said second voltage and a level of said first voltage.

4. The method of claim 1, wherein:
applying said inhibit voltage to said first set of non-volatile storage elements begins after applying said first voltage to said set of word lines begins and before applying said second voltage to said set of word lines begins.

5. The method of claim 1, wherein:
said first set of non-volatile storage elements is a NAND string of non-volatile storage elements.

6. The method of claim 1, further comprising:
verifying that said second set of non-volatile storage elements is not soft programmed after applying said second voltage;
applying a third voltage to said set of word lines to enable pre-charging of said first set of non-volatile storage elements;
while said third voltage is applied to each word line in said set of word lines, applying said inhibit voltage to said bit line for said first set of non-volatile storage elements to pre-charge said channel region of said first set of non-volatile storage elements; and
while said inhibit voltage is applied to said bit line for said first set of non-volatile storage elements, applying a fourth voltage to said set of word lines to soft program said second set of non-volatile storage elements, said fourth voltage is higher than said second voltage;
wherein a difference between a level of said fourth voltage and said third voltage is different than a difference between a level of said second voltage and said first voltage.

7. A method of soft programming non-volatile memory, comprising:
applying a first pre-charge enable voltage to a set of word lines coupled to a first set of non-volatile storage elements and a second set of non-volatile storage elements;
pre-charging a channel region of said first set of non-volatile storage elements while applying said first pre-charge enable voltage to said set of word lines;
applying a first soft programming voltage to said set of word lines after pre-charging said channel region of said first set of non-volatile storage elements;
applying a second pre-charge enable voltage to said set of word lines after applying said first soft programming voltage, said second pre-charge enable voltage is higher than said first pre-charge enable voltage;
pre-charging a channel region of said first set of non-volatile storage elements while applying said second pre-charge enable voltage to said set of word lines; and
applying a second soft programming voltage to said set of word lines after pre-charging said channel region of said first set of non-volatile storage elements, said second soft programming voltage is higher than said first soft programming voltage.

8. The method of claim 7, further comprising:
applying an inhibit voltage to a bit line associated with said first set of non-volatile storage elements after beginning application of said first pre-charge enable voltage to said set of word lines and before beginning application of said first soft programming voltage.

9. The method of claim 8, further comprising:
applying an enable voltage to a bit line associated with said second set of non-volatile storage elements prior to applying said first soft programming voltage.

10. The method of claim 7, wherein:
a difference between a level of said first soft programming voltage and a level of said first pre-charge enable voltage is equal to a difference between a level of said second soft programming voltage and a level of said second pre-charge enable voltage.

11. The method of claim 7, wherein:
a difference between a level of said first soft programming voltage and said first pre-charge enable voltage is different than a difference between a level of said second soft programming voltage and a level of said second pre-charge enable voltage.

12. The method of claim 7, wherein:
said first pre-charge enable voltage is different from a read pass voltage applied to unselected ones of said word lines when reading said first set of non-volatile storage elements and said second set of non-volatile storage elements.

13. The method of claim 7, wherein:
said second pre-charge enable voltage is different from a read pass voltage applied to unselected ones of said word lines when reading said first set of non-volatile storage elements and said second set of non-volatile storage elements.

14. The method of claim 7, wherein:
said first set of non-volatile storage elements is a first NAND string; and
said second set of non-volatile storage elements is a second NAND string.

15. A method of soft-programming non-volatile memory, comprising:
simultaneously applying a first programming voltage pulse to each word line of a set of word lines, said first programming voltage pulse including a first pre-charge enable voltage followed by a first soft programming voltage; and
after applying said first programming voltage pulse, simultaneously applying a second programming voltage pulse to each word line of said set of word lines, said second programming voltage pulse including a second pre-charge enable voltage followed by a second soft programming voltage, said second pre-charge enable voltage is higher than said first pre-charge enable voltage and said second soft programming voltage is higher than said first soft programming voltage.

16. The method of claim 15, wherein:
a difference between said first soft programming voltage and said first pre-charge enable voltage is equal to a difference between said second soft programming voltage and said second pre-charge enable voltage.

17. The method of claim 15, wherein:
a difference between said first soft programming voltage and said first pre-charge enable voltage is different than a difference between said second soft programming voltage and said second pre-charge enable voltage.

18. The method of claim 15, further comprising, while applying said first programming voltage pulse and said second programming voltage pulse;
applying an inhibit voltage to a bit line for a first NAND string and applying an enable voltage to a bit line for a second NAND string, said first NAND string and said second NAND string are coupled to said set of word lines.

19. The method of claim 15, wherein:
said first pre-charge enable voltage and said second pre-charge enable voltage are different from a read pass voltage applied to unselected ones of said word lines when reading said non-volatile memory.

* * * * *